US009885766B2

(12) United States Patent
Avdievich et al.

(10) Patent No.: US 9,885,766 B2
(45) Date of Patent: Feb. 6, 2018

(54) MAGNETIC-RESONANCE TRANSCEIVER-PHASED ARRAY THAT COMPENSATES FOR REACTIVE AND RESISTIVE COMPONENTS OF MUTUAL IMPEDANCE BETWEEN ARRAY ELEMENTS AND CIRCUIT AND METHOD THEREOF

(71) Applicant: Transarray LLC, Lexington, MA (US)

(72) Inventors: Nikolai I. Avdievich, Bronx, NY (US); Hoby P. Hetherington, Woodbridge, CT (US); Jullie W. Pan, Woodbridge, CT (US)

(73) Assignee: Transarray LLC, Lexington, MA (US)

( * ) Notice: Subject to any disclaimer, the term of this patent is extended or adjusted under 35 U.S.C. 154(b) by 1300 days.

(21) Appl. No.: 13/864,980

(22) Filed: Apr. 17, 2013

(65) Prior Publication Data

US 2013/0271144 A1 Oct. 17, 2013

Related U.S. Application Data

(60) Provisional application No. 61/625,196, filed on Apr. 17, 2012.

(51) Int. Cl.
*G01V 3/00* (2006.01)
*G01R 33/36* (2006.01)
*G01R 33/3415* (2006.01)

(52) U.S. Cl.
CPC ....... *G01R 33/3642* (2013.01); *G01R 33/365* (2013.01); *G01R 33/3635* (2013.01); *G01R 33/3415* (2013.01)

(58) Field of Classification Search
CPC .................................................... G01R 33/365
(Continued)

(56) References Cited

U.S. PATENT DOCUMENTS

| | | | |
|---|---|---|---|
| 4,129,822 A | 12/1978 | Traficante | 324/0.5 AH |
| 4,320,342 A | 3/1982 | Heinzerling | 324/319 |

(Continued)

FOREIGN PATENT DOCUMENTS

| | | | |
|---|---|---|---|
| EP | 0180121 | 2/1990 | G01N 24/08 |
| EP | 1363135 | 11/2003 | G01R 33/36 |

(Continued)

OTHER PUBLICATIONS

Aal-Braij et al., "A novel inter-resonant coil decoupling technique for parallel imaging," *Proc. Intl. Soc. Mag. Reson. Med.*, vol. 17, p. 2974 (2009).

(Continued)

*Primary Examiner* — Louis Arana
(74) *Attorney, Agent, or Firm* — Sunstein Kann Murphy & Timbers LLP

(57) ABSTRACT

There is provided a novel method and circuit of compensating for cross-talk between pairs of adjacent array elements of a transceiver phased array and double-tuned transceiver arrays for a magnetic resonance system using a resonant inductive decoupling circuit. The geometry and size of the resonant inductive decoupling circuit allows for the decoupling circuit to compensate for the cross-talk between array elements, including the reactive and resistive components of the mutual impedance while being sufficiently small to not distort a RF magnetic field of the array elements produced within a sample.

25 Claims, 18 Drawing Sheets

(58) Field of Classification Search
USPC .................................................. 324/322, 318
See application file for complete search history.

(56) References Cited

U.S. PATENT DOCUMENTS

| | | | |
|---|---|---|---|
| 4,638,253 A | 1/1987 | Jaskolski et al. ............. | 324/318 |
| 4,721,915 A | 1/1988 | Kestler ......................... | 324/322 |
| 4,725,780 A | 2/1988 | Yoda et al. ................... | 324/318 |
| 4,731,584 A | 3/1988 | Misic et al. .................. | 324/318 |
| 4,737,718 A | 4/1988 | Kemner et al. ............... | 324/322 |
| 4,751,464 A | 6/1988 | Bridges ......................... | 324/318 |
| 4,752,736 A | 6/1988 | Arakawa et al. .............. | 324/318 |
| 4,780,677 A | 10/1988 | Nissenson et al. ........... | 324/322 |
| 4,783,641 A | 11/1988 | Hayes et al. .................. | 333/219 |
| 4,788,503 A | 11/1988 | Van Heelsbergen .......... | 324/322 |
| 4,820,985 A | 4/1989 | Eash .............................. | 324/318 |
| 4,871,969 A | 10/1989 | Roemer et al. ............... | 324/318 |
| 4,879,516 A | 11/1989 | Medhdizadeh et al. ...... | 324/318 |
| 4,885,539 A | 12/1989 | Roemer et al. ............... | 324/318 |
| 4,918,388 A | 4/1990 | Mehdizadeh et al. ........ | 324/322 |
| 4,926,125 A | 5/1990 | Roemer ......................... | 324/318 |
| 5,081,418 A | 1/1992 | Hayes et al. .................. | 324/322 |
| 5,159,929 A | 11/1992 | Morris et al. ................. | 128/653.2 |
| 5,172,061 A | 12/1992 | Crooks et al. ................ | 324/322 |
| 5,185,575 A | 2/1993 | Overweg ....................... | 324/309 |
| 5,196,797 A | 3/1993 | Tropp ............................ | 324/322 |
| 5,243,286 A | 9/1993 | Rzedzian et al. ............. | 324/318 |
| 5,278,505 A | 1/1994 | Arakawa ....................... | 324/322 |
| 5,365,173 A | 11/1994 | Zou et al. ...................... | 324/318 |
| 5,461,314 A | 10/1995 | Arakawa et al. .............. | 324/318 |
| 5,473,252 A | 12/1995 | Renz et al. .................... | 324/318 |
| 5,483,158 A | 1/1996 | van Heteren et al. ........ | 324/318 |
| 5,483,163 A | 1/1996 | Wen et al. ..................... | 324/318 |
| 5,559,434 A | 9/1996 | Takahashi et al. ............ | 324/318 |
| 5,565,779 A | 10/1996 | Arakawa et al. .............. | 324/318 |
| 5,610,521 A | 3/1997 | Zou et al. ...................... | 324/318 |
| 5,642,048 A | 6/1997 | Crozier et al. ................ | 324/318 |
| 5,791,648 A | 8/1998 | Hohl .............................. | 273/238 |
| 5,804,969 A | 9/1998 | Lian et al. ..................... | 324/318 |
| 5,998,999 A | 12/1999 | Richard et al. ............... | 324/318 |
| 6,011,395 A | 1/2000 | Leifer et al. .................. | 324/318 |
| 6,107,798 A | 8/2000 | Hoult ............................ | 324/318 |
| 6,414,488 B1 | 7/2002 | Chmielewski ................ | 324/311 |
| 6,504,369 B1 | 1/2003 | Varjo et al. .................... | 324/318 |
| 6,538,442 B2 | 3/2003 | Boskamp ...................... | 324/318 |
| 6,552,544 B2 | 4/2003 | Wong et al. ................... | 324/318 |
| 6,639,406 B1 | 10/2003 | Boskamp et al. ............. | 324/318 |
| 6,727,703 B2 | 4/2004 | Lee ................................ | 324/322 |
| 6,771,070 B2 | 8/2004 | Lee ................................ | 324/318 |
| 6,853,193 B2 | 2/2005 | Riederer et al. .............. | 324/318 |
| 6,879,159 B2 | 4/2005 | Yoshida ........................ | 324/318 |
| 6,927,575 B2 | 8/2005 | Burl et al. ..................... | 324/318 |
| 6,940,466 B2 | 9/2005 | Terry ............................. | 343/841 |
| 7,012,429 B1 | 3/2006 | Ledden ......................... | 324/318 |
| 7,088,100 B2 | 8/2006 | Boskamp et al. ............. | 324/318 |
| 7,088,104 B2 | 8/2006 | Bottomley .................... | 324/328 |
| 7,136,023 B2 * | 11/2006 | Reykowski .......... | G01R 33/365 324/318 |
| 7,173,425 B2 | 2/2007 | Boskamp et al. ............. | 324/318 |
| 7,285,957 B2 | 10/2007 | Boskamp et al. ............. | 324/318 |
| 7,298,145 B2 | 11/2007 | Neufeld et al. ............... | 324/318 |
| 7,345,485 B2 | 3/2008 | Jevtic et al. ................... | 324/322 |
| 7,358,923 B2 | 4/2008 | Terry ............................. | 343/841 |
| 7,501,823 B2 | 3/2009 | Nistler et al. ................. | 324/318 |
| 7,573,270 B2 | 8/2009 | Neufeld et al. ............... | 324/318 |
| 7,898,252 B2 | 3/2011 | Crozier et al. ................ | 324/307 |
| 8,035,382 B2 * | 10/2011 | DeVries ............. | G01R 33/3403 324/318 |
| 8,049,502 B2 | 11/2011 | Odintsov | |
| 8,138,762 B2 | 3/2012 | Zhu ............................... | 324/322 |
| 8,314,614 B2 | 11/2012 | Eggers et al. ................. | 324/307 |
| 8,742,759 B2 * | 6/2014 | Soutome ............. | G01R 33/365 324/318 |
| 2004/0189300 A1 | 9/2004 | Burl et al. ..................... | 324/318 |
| 2012/0112748 A1 | 5/2012 | Hetherington et al. ...... | 324/318 |
| 2012/0223706 A1 | 9/2012 | Hetherington et al. ...... | 324/307 |
| 2015/0355297 A1 * | 12/2015 | Menon ................. | G01R 33/422 324/322 |

FOREIGN PATENT DOCUMENTS

| | | | |
|---|---|---|---|
| EP | 1852710 | 11/2007 | ............. G01R 33/36 |
| WO | WO 2007/117604 | 10/2007 | ........... G01R 33/465 |

OTHER PUBLICATIONS

Adriany et al., "Transmit and Receive Transmission Line Arrays for 7 Tesla Parallel Imaging," *Magnetic Resonance in Medicine*, vol. 53, pp. 434-445 (2005).

Adriany et al., "A 32-Channel Lattice Transmission Line Array for Parallel Transmit and Receive MRI at 7 Tesla," *National Institute of Health, Public Access Author Manuscript, Magnetic Resonance in Medicine*, vol. 63(6), pp. 1478-1485, Jun. 2010.

Avdievich, "Transceiver-Phased Arrays for Human Brain Studies at 7 T," *National Institute of Health, Public Access Author Manuscript, Appl. Magn. Reson.*, vol. 41(2-4), pp. 483-506, Dec. 2011.

Avdievich et al., Short Echo Spectroscopic Imaging of the Human Brain at 7T Using Transceiver Arrays, *Magnetic Resonance in Medicine*, vol. 62, pp. 17-25 (2009).

Avdievich et al., "Novel Inductive Decoupling for Single-and Double-Tuned Transceiver Phased Arrays to Compensate for both Reactive and Resistive Components of the Mutual Impedance," *Proc. Intl. Soc. Mag. Reson. Med.*, vol. 20, p. 2806, (2012).

Beck et al., "Tissue-Equivalent Phantoms for High Frequencies," *Concepts in Magnetic Resonance Part B, Magnetic Resonance Engineering*, vol. 20B(1), pp. 30-33 (2004).

Dabirzadeh et al., "Trap Design for Insertable Second-Nuclei Radiofrequency Coils for Magnetic Resonance Imaging and Spectroscopy," *Concepts in Magnetic Resonance Part B, Magnetic Resonance Engineering*, vol. 35B(3), pp. 121-132 (2009).

Gilbert et al., "Transmit/Receive Radiofrequency Coil With Individually Shielded Elements," *Magnetic Resonance in Medicine*, vol. 64, pp. 1640-1651 (2010).

Gilbert et al., "A Conformal Transceive Array for 7 T Neuroimaging," *Magnetic Resonance in Medicine*, vol. 67, pp. 1487-1496 (2012).

Harpen, "Radiative Losses of a Birdcage Resonator," *Magnetic Resonance in Medicine*, vol. 29, pp. 713-716 (1993).

Ibrahim et al., "Insight Into RF Power Requirements and $B_1$ Field Homogeneity for Human MRI Via Rigorous FDTD Approach," *Journal of Magnetic Resonance Imaging*, vol. 25, pp. 1235-1247 (2007).

Katscher et al., "Transmit SENSE," *Magnetic Resonance in Medicine*, vol. 49, pp. 144-150 (2003).

Keil et al., "Size-optimized 32-Channel Brain Arrays for 3 T Pediatric Imaging," *Magnetic Resonance in Medicine*, vol. 66, pp. 1777-1787 (2011).

Klomp et al., "Radio-frequency probe for 1H decoupled 31P MRS of the head and neck region," Magnetic Resonance Imaging, vol. 19, pp. 755-759 (2001).

Kozlov et al., "Analysis of RF transmit performance for a multi-row multi-channel MRI loop array at 300 and 400 MHz," *Proceedings of the Asia-Pacific Microwave Conference*, pp. 1190-1193 (2011).

Kraff et al., "An Eight-Channel Phased Array RF Coil for Spine MR Imaging at 7 T," *Investigative Radiology*, vol. 44(11), pp. 734-740, Nov. 2009.

Li et al., "ICE decoupling technique for RF coil array designs," *Am. Assoc. Phys. Med.*, vol. 38, No. 7, pp. 4086-4093, Jul. 2011.

Mao et al., "Exploring the Limits of RF Shimming for High-Field MRI of the Human Head," *Magnetic Resonance in Medicine*, vol. 56, pp. 918-922 (2006).

Pan et al., "Quantitative Spectroscopic Imaging of the Human Brain," *Magnetic Resonance in Medicine*, vol. 40, pp. 363-369 (1998).

(56) References Cited

OTHER PUBLICATIONS

Picard et al., "Improvements in Electronic Decoupling of Transmitter and Receiver Coils," *Journal of Magnetic Resonance, Series B*, vol. 106, pp. 110-115 (1995).

Pinkerton et al., "Transceive Surface Coil Array for Magnetic Resonance Imaging of the Human Brain at 4 T," *Magnetic Resonance in Medicine*, vol. 54, pp. 499-503 (2005).

Roemer et al., "The NMR Phased Array," *Magnetic Resonance in Medicine*, vol. 16, pp. 192-225 (1990).

Schnall et al., "A New Double-Tuned Probe for Concurrent $^1$H and $^{31}$P NMR*," *Journal of Magnetic Resonance*, vol. 65, pp. 122-129 (1985).

Shajan et al., "A 16-Element Dual-row Transmit Coil Array for 3D RF Shimming at 9.4 T," *Proc. Intl. Soc. Mag. Reson. Med.*, vol. 20, p. 308 (2012).

Soutome et al., "Vertical Loop Decoupling Method for Gapped Phased-Array Coils," *Proc. Intl. Soc. Mag. Reson. Med.*, vol. 19, p. 1859 (2011).

Sucher et al., "Handbook of Microwave Measurements," *Wiley & Sons, Inc., Polytechnic Press of the Polytechnic Institute of Brooklyn*, 87 pages (1963).

Tropp, "Mutual Inductance in the Bird-Cage Resonator*," *Journal of Magnetic Resonance*, vol. 126, Article No. MN971149, pp. 9-17 (1997).

Vaughan et al., "7T vs. 4T: RF Power, Homogeneity, and Signal-to-Noise Comparison in Head Images," *Magnetic Resonance in Medicine*, vol. 46, pp. 24-30 (2001).

Von Morze et al., "An Eight-Channel, Novoverlapping Phased Array Coil with Capacitive Decoupling for Parallel MRI at 3 T," *Concepts in Magnetic Resonance Part B, Magnetic Resonance Engineering*, vol. 31B(1), pp. 37-43 (2007).

Wright, "Full-Wave Analysis of Planar Radiofrequency Coils and Coil Arrays with Assumed Current Distribution," *Concepts in Magnetic Resonance Part B, Magnetic Resonance Engineering*, vol. 15(1), pp. 2-14 (2002).

Wu et al., "Interconnecting L/C Components for Decoupling and Its Application to Low-Field Open MRI Array," *Concepts in Magnetic Resonance Part B, Magnetic Resonance Engineering*, vol. 31B(2), pp. 116-126 (2007).

Wu et al., "Shielded Microstrip Array for 7T Human MR Imaging," *IEEE Transactions on Medical Imaging*, vol. 29(1), pp. 179-184, Jan. 2010.

Wu et al., "7T Human Spine Imaging Arrays With Adjustable Inductive Decoupling, National Institute of Health," *Public Access Author Manuscript, IEEE Trans Biomed Eng.*, vol. 57(2), pp. 397-403, Feb. 2010.

Wu et al., "Flexible Transceiver Array for Ultrahigh Field Human MR Imaging," *Wiley Periodicals, Inc., Magnetic Resonance in Medicine*, pp. 1-7 (2012).

Wu et al., "Multi-Channel Microstrip Transceiver Arrays Using Harmonics for High Field MR Imaging in Humans," *National Institute of Health, Public Access Author Manuscript, IEEE Trans Med Imaging*, vol. 31(2), pp. 183-191, Feb. 2012.

Zhang et al., "Reduction of Transmitter $B_1$ Inhomogeneity With Transmit SENSE Slice-Select Pulses," *Magnetic Resonance in Medicine*, vol. 57, pp. 842-847 (2007).

Zhu, "Parallel Excitation With an Array of Transmit Coils," *Magnetic Resonance in Medicine*, vol. 51, pp. 775-784 (2004).

* cited by examiner (Type II RID)

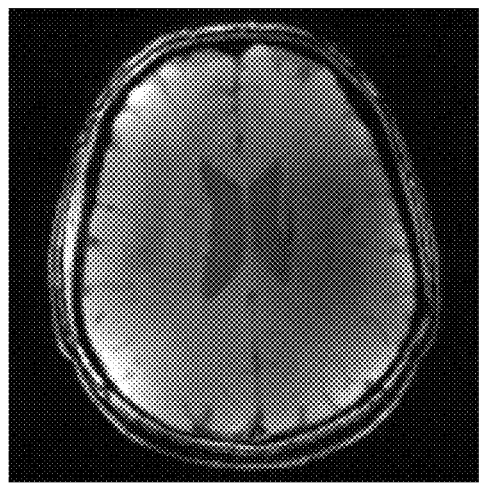
Fig. 16A
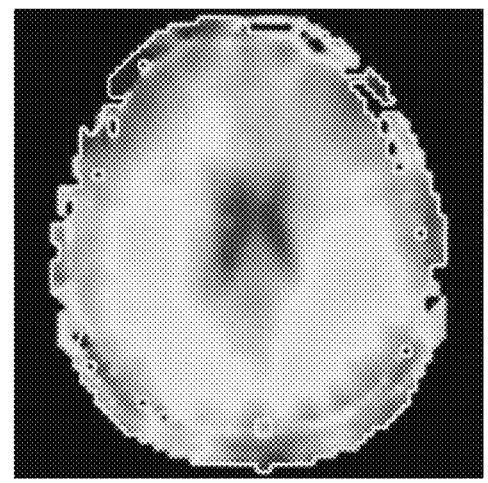
Fig. 16B
Fig. 17A          Fig. 17A
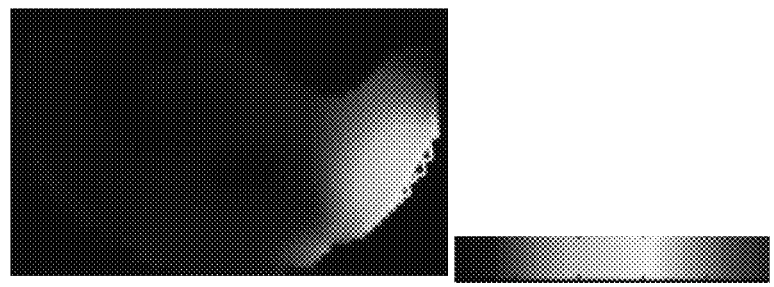
Fig. 17C     0 KHz          15 KHz

MAGNETIC-RESONANCE TRANSCEIVER-PHASED ARRAY THAT COMPENSATES FOR REACTIVE AND RESISTIVE COMPONENTS OF MUTUAL IMPEDANCE BETWEEN ARRAY ELEMENTS AND CIRCUIT AND METHOD THEREOF

PRIORITY

The present application claims priority from Provisional Application No. 61/625,196 filed Apr. 17, 2012, titled "Resonant Inductive Decoupling for MRI Transceiver Phased Arrays to Compensate for both Reactive and Resistive Components of the Mutual Impedance." The application is incorporated by reference herein in its entirety.

GOVERNMENT RIGHTS

This invention was made with government support under Contract no. EB009871 and Contract No. EB011639 awarded by the National Institute of Health. The government has certain rights in the invention.

TECHNICAL FIELD

The present invention relates to decoupling methodologies and circuits thereof for array elements of a magnetic-resonance transceiver phased array, and more particularly to compensating for cross-talk among the array elements using a resonant inductive decoupling circuit.

BACKGROUND ART

Transceiver phased arrays (also referred to as transceiver surface-coil arrays) may improve transmission performance ($B_1/\sqrt{kW}$) and $B_1$ homogeneity for magnetic-resonance head imaging up to 9.4 T (Tesla). To further improve reception performance and parallel imaging, the number of array elements has to be increased with correspondent decrease of their size. With a large number of small interacting antennas, decoupling is one of the most challenging aspects in the design and construction of transceiver arrays. Previously described decoupling techniques (for example, using geometric overlap, inductive or capacitive decoupling) have generally focused on eliminating only the reactance component of the mutual impedance. These decoupling methods may limit the obtainable decoupling by as much as −10 dB due to residual mutual resistance.

$B_1$ magnetic field homogeneity generally refers to the homogeneity or inhomogeneity of a $B_1$ magnetic field quantified by the standard deviation of the amplitude of the $B_1$ magnetic field over a given region. The $B_1$ magnetic field refers to the time-varying magnetic field generated by an RF antenna and is applied perpendicularly to the $B_0$ magnetic field to alter the orientation of the nuclear spins of the nuclei of interest in the sample. The $B_0$ magnetic field generally refers the primary static magnetic field applied by a MR system to a sample.

At high magnetic field strengths, where the object size becomes comparable to the RF wavelength, increased RF inhomogeneity, decreased transmit efficiency ($\mu T/\sqrt{W}$), and increasing local specific absorption rate (SAR) pose significant limitations for conventional single-channel transmit volume coils. For example, for body imaging, such limitations may be observed at 3 T and above, and for head imaging, such limitations may be observed at 7 T and above.

SAR generally refers to the measure of the rate at which energy is absorbed by the nuclei when excited to the $B_1$ magnetic field. Transmission efficiency generally refers to the intensity of the $B_1$ magnetic field generated by a coil element expressed in a unit of intensity (pT, $\mu$T, gauss, or Hz equivalent) as a function of the power applied to the RF coil to achieve that intensity.

To overcome these limitations, substantial effort has been focused on the development of transceiver phased arrays consisting of multiple independent (i.e. decoupled) RF antennas used simultaneously for both transmission and reception. Transceiver phased arrays provide improved homogeneity, enhanced transmit efficiency and decreased SAR through the use of RF shimming and parallel transmission.

RF shimming has been described in Adriany et al, *Transmit and receive transmission line arrays for 7 Tesla parallel imaging.* 53 MAGN. RESON. MED. 434-445 (2005); Mao et al, *Exploring the limits of RF shimming for high-field MRI of the human head*, 56(4) MAGN. RESON. MED. 918-922 (2006); Ibrahim et al, *Insight into RF power requirements and B1 field homogeneity for human MRI via rigorous FDTD approach*, 25(6) J. MAGN. RESON. IMAG. 1235-1247 (2007); Avdievich et al, *Short Echo Spectroscopic Imaging of the Human Brain at 7T Using Transceiver Arrays*, 62 MAGN. RES. MED. 17-25 (2009); and Kozlov et al, *Analysis of RF transmit performance for a multi-row multi-channel MRI loop array at* 300 *and* 400 *MHz*, Proceedings of the Asia-Pacific Microwave Conference, Melbourne, Australia 1190-1193 (2011).

Parallel transmission has been described in Katscher et al, Transmit SENSE, 49 MAGN. RESON. MED. 144-50 (2003); Zhu, *Parallel excitation with an array of transmit coils,* 51 MAGN. RES. MED. 775-784 (2004); and Zhang et al, *Reduction of transmitter B1 inhomogeneity with transmit SENSE slice-select pulses,* 57(5) MAGN. RESON. MED. 842-847 (2007).

Head arrays with surface coils as individual elements have been successfully utilized at 7 T and above. These efforts are described in Avdievich et al, *Short Echo Spectroscopic Imaging of the Human Brain at 7T Using Transceiver Arrays,* 62 MAGN. RES. MED. 17-25 (2009); Avdievich, *Transceiver phased arrays for human brain studies at 7T,* 41(2) APPL. MAGN. RESON. 483-506 (2011); Gilbert et al, *A conformal transceive array for 7 T neuroimaging,* 67 MAGN. RESON. MED. 1487-1496 (2012); and Shajan et al, *A* 16-*Element dual-row transmit coil array for* 3D *RF shimming at* 9.4 *T*, PROC. OF THE 20TH ANNUAL MEETING ISMRM, Melbourne, Australia 308 (2012).

Conventional MR systems typically employ a single transmission coil, to generate the RF magnetic field, commonly referred to as the $B_1$ magnetic field. At higher magnetic field strengths, the wavelength of the RF magnetic field becomes comparable to the size of the sample (i.e. body imaging at 3T and above, head imaging at 7T and above). Also, with increase in the $B_0$ magnetic field, the peak requirement for the B1 magnetic field has to also substantially increase while the transmission efficiency decreases. This result has been observed and described in "7 vs. 4T: F power, homogeneity, and signal-to-noise comparison in heat images," *Magn. Reson. Med.* 46(1):24-30 (2001). Thus, at high magnetic field, it has been observed that a performance of a single transmission coil is significantly limited by increased RF inhomogeneity, decreased transmit efficiency ($\mu T/W$), and increased local specific absorption rate (SAR). Thus, transceiver phased arrays are more suited for higher magnetic field MR systems.

Transceiver phased arrays generally consist of multiple independent (i.e. decoupled) RF antennas configured to operate simultaneously for both transmission and reception. More array elements may improve the efficiency and homogeneity of the RF magnetic field being transmitted, reduce the effects of localized absorption regions, improve the sensitivity of the reception, as well as provide for parallel measurements. Each array element generally interacts with neighboring and non-neighboring elements in the array. The interaction is referred to as cross-talk and affects the RF field profile of the array, thus degrading the array transmission and reception performance, thereby lowering the signal-to-noise ratio (SNR) of the transceiver phased array. Examples of transceiver phased array are provided in US Patent Application, Publication No. 2012/0112748, titled "Transceiver Apparatus, System, and Methodology For Superior In-Vivo Imaging of Human Anatomy," filed Aug. 18, 2011, by Hoby P. Hetherington, Jullie W. Pan, and Nikolai I. Advievich, which is incorporated by reference herein it is entirety.

Transceiver phased arrays may be used as conventional phased arrays for reception with the sensitivity of the receiver maintained. To provide sufficient coverage of the entire object during transmission and high signal-to-noise ratio (SNR) comparable with commercially available multichannel receive-only arrays, the transceiver phased arrays may include multiple rows of smaller RF elements. For example, two or three rows of eight elements (2×8 and 3×8) may be employed for a head-sized array.

To overcome these limitations, substantial effort has been focused on the development of transceiver phased-arrays consisting of multiple independent (i.e. decoupled) RF antennas used simultaneously for both transmission and reception. With a large number of interacting RF antennas, decoupling, i.e. eliminating the cross talk, is becoming one of the most challenging and critical aspects in designing and constructing transceiver phased arrays.

It is known in the art to decouple array elements (also referred to as surface coils) of transceiver phased arrays using inductive or capacitive decoupling methodologies, thereby eliminating or reducing cross-talk. For certain geometries of individual antennas (e.g. overlapped surface coils) the cross-talk may include both reactive and a significant resistive components. All previously developed decoupling methods deal with eliminating only the reactive component of coupling (i.e. mutual inductance). Therefore, in these cases, use of any previously described decoupling schemes does not provide a complete decoupling of the array elements.

Compensating for both the resistive (real) and reactive (imaginary) components of the cross-talk may yield improved transceiver surface-coil arrays performance, thereby improving the sensitivity and imaging quality of the magnetic resonance system. Methods of decoupling the array elements using a resonant inductive decoupling circuit that eliminates the reactive component of the mutual impedance between array elements are also known in the art.

Overlapping of adjacent array elements is a common inductive decoupling technique and enables larger and greater numbers of RF coils to be used for a given circumference of the array. This technique is described in Roemer et al, *The NMR phased array*, 16 MAGN. RESON. MED. 192-225 (1990); Kraff et al, *An eight-channel phased array RF coil for spine MR imaging at 7 T*, 44(11) INVEST. RADIOL. 734-740 (2009); and Keil et al, *Size-optimized 32-channel brain arrays for 3 T pediatric imaging*, 66 MAGN. RESON. MED. 1777-1787 (2011), which are all incorporated by reference herein in their entirety.

Resonant inductive decoupling (RID) provides a way to compensate for both the reactive and the resistive components of the mutual impedance, $Z_{12}$ (20). It also offers an easy way to adjust the decoupling, by changing the resonant frequency of the decoupling circuit through adjustment of a single variable capacitor. However, the placement and the geometry of these RID elements are critical since the RF field generated by the RID can significantly alter the RF field of the array.

SUMMARY OF THE EMBODIMENTS

In a first embodiment of the invention, there is provided a novel method of compensating for cross-talk between pairs of adjacent array elements of a transceiver phased array for a magnetic resonance (MR) system. The transceiver phased array includes array elements circumscribing a sample. In an embodiment, a method of operating a transceiver phased array decoupled using the illustrative embodiment is provided. The transceiver phased array is operated in the MR system to produce a dataset of the sample. The dataset may be used to derive (i) an image using various described MR imaging modalities or (ii) spectroscopic data using various measurement modalities described herein. The transceiver array elements, i.e. RF antennas, may be configured as surface coils used for both for transmission and reception of RF signals. During transmission and reception, the pair of array elements has cross-talk characterized as mutual impedance therebetween, which may include both resistive and reactive components.

The method includes providing a sample within the magnetic resonance system. Pairs of adjacent array elements of the transceiver phased array may be energized to cause transmission of a RF magnetic field (i.e., $B_1$ magnetic field) and reception of a resonance signal from the sample. Each pair of the adjacent array elements may include a resonant inductive decoupling circuit that compensates for both the reactive and resistive components of the mutual impedance between each pair of array elements during transmission and reception. The method includes producing the data set based on the received resonance signal.

The resonant inductive decoupling circuit inductively couples to the pair of array elements to compensate for both the reactive and resistive components of the mutual impedance of the pair of array elements. The coupling is performed in a manner so as to not distort a RF magnetic field of the array elements produced in the sample.

The resonant inductive decoupling circuit may be configured such that flux generated by the pair of array elements produces two currents of opposing direction in the resonant inductive decoupling circuit, which provides conditions for compensation for both the reactive and resistive component of the mutual impedance between the pair of array elements.

The resonant inductive decoupling circuit may consist of (i) two small two-turn inductors, where each inductor is connected in series with each array element of the pair of adjacent array elements and (ii) an electrically insulated resonant coil with a pair of two-turn windings, where each winding is coupled to each small inductor. Each of the two small inductors of the array elements and each of the pair of windings of the resonant coil may have two to four turns.

The resonant inductive decoupling circuit may resonate at a resonant frequency $\omega_0$ sufficiently distant from a resonance frequency $\omega_L$ of the array elements to compensate for both the reactive and resistive component of the mutual impedance between the pair of array elements. The difference between $\omega_0$ and $\omega_L$, or frequency shift, may be equal to $$\frac{k}{2\eta}\frac{Q}{Q_0}\omega_L,$$

where k is the coupling coefficient between array elements of the pair of array elements, $Q_o$ is a Q-factor of the resonant inductive decoupling circuit, Q is a Q-factor of the array elements, $\eta$ is a ratio between (i) a resistive component $R_{12}$ between the resonant inductive decoupling circuit and the array elements and (ii) a resistance value R of the array elements, and $\omega_L$ is the resonance frequency of the array elements. The resonant inductive decoupling circuit may have a geometry and size that produce a coupling coefficient $k_0$ with the array element sufficiently large to provide for sufficiently large frequency shift (or difference) between $\omega_0$ and $\omega_L$. In an embodiment, the coupling coefficient $k_0$ may be equal to $$k\sqrt{\frac{Q_0}{\eta Q}},$$

where k is the coupling coefficient between array elements of the pair of array elements. The coupling coefficient may have a value greater than 0.08 to provide for the frequency shift of greater than 10% of $\omega_L$ to not distort a RF magnetic field of the array elements produced within a sample.

The size of the resonant inductive decoupling circuit may be sufficiently small so as not to distort a RF magnetic field of the array elements produced within a sample. In an embodiment, the size of the inductors of the resonant inductive decoupling circuit is less than thirty percent of the distance between the array elements and the sample.

In another embodiment of the invention, there is provided a transceiver phased array for a magnetic-resonance system. The transceiver phased array is adapted with a plurality of array elements configured to circumscribe a sample. The plurality of array elements may be overlapping or non-overlapping. Array elements, i.e., RF antennas, may be configured for transmission of a RF magnetic field and reception of a resonance signal and may be configured as a surface coils. Adjacent pair of array elements may have cross-talk characterized as a mutual impedance therebetween, which includes resistive and reactive components.

The transceiver phased array includes a resonant inductive decoupling circuit to cancel the cross-talk between the array elements. The resonant inductive decoupling circuit is configured to inductively couple to a pair of adjacent array elements and compensates for the reactive and resistive components of the mutual impedance therebetween. The resonant inductive decoupling circuit is configured to inductively couple to the pair of array elements in a manner not to distort the RF magnetic field of the array element produced within the sample. In another embodiment, the resonant inductive decoupling circuit is further employed to inductively couple non-adjacent pairs of array elements.

The RID circuit may consist of (i) two small two-turn inductors, where each inductor is connected in series with each array element of the pair of array elements and (ii) an electrically insulated resonant coil with a pair of multi-turn windings, where each winding is coupled to each small inductor. The two small inductors of the array elements and the pair of windings of the resonant coil may have two to four turns. The two small inductors of the array elements and the pair of windings of the resonant coil may form a transformer.

In an embodiment, each of the inductors of the pair of array elements may be interleaved to the corresponding inductors of the resonant inductive decoupling circuit. In alternative embodiments, the inductors of the pair of array elements may be placed alongside the corresponding inductors of the resonant inductive decoupling circuit. The inductors of the pair of array elements may be placed on the same side or the opposite side of corresponding inductors of the resonant inductive decoupling circuit.

The resonant inductive decoupling circuit may be configured such that flux generated by the pair of array elements produces two currents of opposing direction in the resonant inductive decoupling circuit. The two currents compensate for both the reactive and resistive component of the mutual impedance between the pair of array elements.

The resonant inductive decoupling circuit may resonate at a resonant frequency $\omega_0$ sufficiently distant from a resonance frequency $\omega_L$ of the array elements to compensate for both the reactive and resistive component of the mutual impedance between the pair of array elements and not distort a RF magnetic field of the array elements produced within a sample. The difference between $\omega d0$ and $\omega_L$, referred to as a frequency shift, may be equal to $$\frac{k}{2\eta}\frac{Q}{Q_0}\omega_L,$$

where k is the coupling coefficient between array elements of the pair of array elements, $Q_o$ is a Q-factor of the resonant inductive decoupling circuit, Q is a Q-factor of the array elements, $\eta$ is a ratio between (i) a resistive component $R_{12}$ between the resonant inductive decoupling circuit and the array elements and (ii) a resistance value R of the array elements, and $\omega_L$ is the resonance frequency of the array elements. The resonant inductive decoupling circuit may have a coupling coefficient $k_0$ with the array element sufficiently large to provide for sufficiently large shift between $\omega_0$ and $\omega_L$ while having a size sufficiently small to not distort a RF magnetic field of the array elements produced within the sample. In an embodiment, the coupling coefficient $k_0$ may be equal to $$k\sqrt{\frac{Q_0}{\eta Q}},$$

where k is the coupling coefficient between array elements of the pair of array elements. The coupling coefficient may be greater than 0.08 to provide for the frequency shift of greater than 10% of $\omega_L$.

The resonant inductive decoupling circuit may include a variable capacitor to tune the resonant inductive decoupling circuit to resonate at the resonant frequency $\omega_0$.

In another embodiment, a high-field multi-element multi-row magnetic-resonance transceiver-phased array is provided. The transceiver phased array includes a plurality of array elements arranged in multiple rows, including a first row of array elements and a second row of array elements. Each array element may have at least one adjacent array element having mutual impedance therebetween. The multi-element multi-row transceiver phased array may include a plurality of resonant inductive decoupling circuit configured to decouple pairs of adjacent array elements. Each resonant inductive decoupling circuit may consist of (i) two small inductors, each inductor connected in series with each array element of the adjacent pair of array elements and (ii) an electrically insulated resonant coil with a pair of windings, each winding coupled to each small inductor. The two small inductors of the array elements and the pair of windings of the resonant coil may have two to four turns. Each pair of the two small inductors of the array elements and the pair of windings of the resonant coil may form a transformer. The resonant inductive decoupling circuit is configured such that it compensate for both the reactive and resistive components of the mutual impedance of each of the pairs of adjacent array elements.

In another embodiment, a double-tuned magnetic-resonance transceiver-phased array is provided. The transceiver phased array includes a plurality of array elements configured to resonant at two pre-specified frequency. The plurality of array elements may be arranged to forms multiple rows, including a first row of array elements and a second row of array elements, consisting of multiple array elements. Each array element may have at least one adjacent array element having mutual impedance therebetween. The transceiver phased array may include a plurality of resonant inductive decoupling circuit configured to dispose between pairs of adjacent array elements. Each resonant inductive decoupling circuit may consist of (i) two small inductors connected in series with the array elements and (ii) an electrically insulated resonant coil with a pair of windings coupled to each array element. The two small inductors of the array elements and the pair of windings of the resonant coil may have two-turns to four turns. The two small inductors of the array elements and the pair of windings of the resonant coil may form a transformer. The resonant inductive decoupling circuit is configured such that it compensate for both the reactive and resistive components of the mutual impedance of each of the pairs of adjacent array elements.

In an embodiment, the plurality of array elements of the double-tuned transceiver phased array may include a set of single double-tuned coil resonating at two frequencies. In another embodiment, the plurality of array elements may include two sets of coils, each coil set configured to resonant a different resonant frequencies. The first coil set may be nested within the second coil set.

BRIEF DESCRIPTION OF THE DRAWINGS

The foregoing features of embodiments will be more readily understood by reference to the following detailed description, taken with reference to the accompanying drawings, in which:

FIG. 16A shows an image of a human patient scanned with a transceiver phased array decoupled with resonant inductive decoupling circuits according to the illustrative embodiment.

FIG. 16B shows an axial $B_1^+$ map corresponding to the scanned image of FIG. 16A.

FIGS. 17A-C show axial $B_1^+$ maps of individual array elements of a $^{31}P/^1H$ double-tuned array obtained decoupled with the resonant inductive decoupling circuit according to the illustrative embodiment.

DETAILED DESCRIPTION OF SPECIFIC EMBODIMENTS

Figure 1:
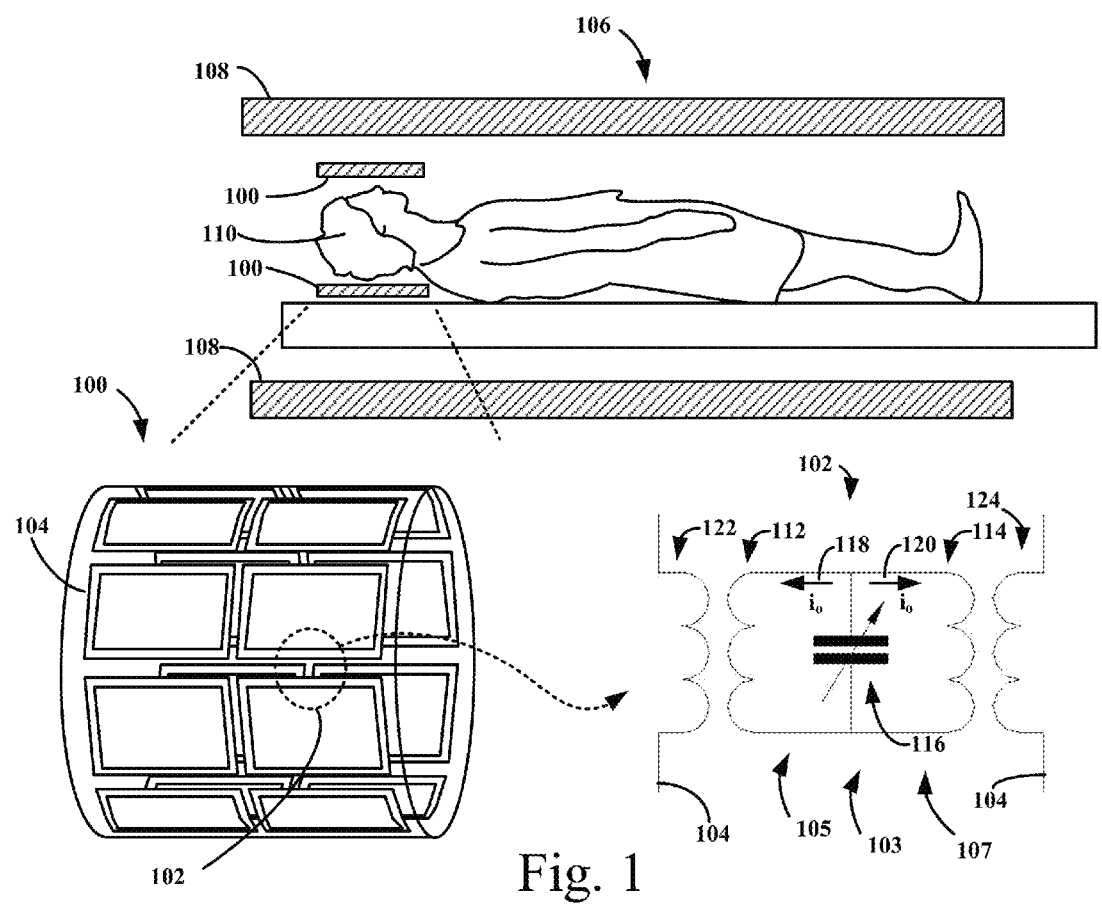
FIG. 1 illustrates a transceiver phased array with resonant inductive decoupling circuits to cancel cross-talk among the array elements according to an illustrative embodiment.

Definitions. As used in this description and the accompanying claims, the following terms shall have the meanings indicated, unless the context otherwise requires:

The term "distortion-less" refers to having minimally disturbed or distorted the RF magnetic field of the RF surface coils.

The term "compensate" (such as in compensating for resistive component of the mutual impedance between array elements) refers to canceling in its entirety, reducing to a lesser degree, and maintaining without increasing.

The term "adjacent" refers to neighboring or being in direct proximity and without having another being disposed in between.

The term "sample" refers to an article, patient, or specimen being imaged, scanned, or measured by a magnetic resonance system, including human patients, biological samples and specimens, as well as non-biological samples and articles.

The term "magnetic resonance system" refers to imaging modalities, such as magnetic-resonance imaging (MRI), nuclear magnetic resonance imaging (NMRI), magnetic resonance tomography (MT), among others, as well as measurement modalities such as nuclear magnetic resonance (NMR) spectroscopy, and magnetic resonance spectroscopy (MRS). Additional background information on magnetic resonance systems are described in US Patent Application (Publication No. 2012/0112748), incorporated by reference herein in its entirety. A large variety of different assemblies and a wide range of alternative systems have been developed over time for performing magnetic resonance systems, and all of these are well established and conventionally known in the technical field. The scope and diversity of these various developments are merely exemplified and represented by U.S. Pat. Nos. 7,573,270; 7,501,823; 7,358,923; 7,358,923; 7,345,485; 7,298,145; 7,285,957; 7,173,425; 7,088,104; 7,088,100; 7,012,429; 6,940,466; 6,853,193; 6,771,070; 6,552,544; 6,538,442; 6,107,798; 6,011,395; 5,998,999; 5,791,648; 5,642,048; 5,610,521; 5,565,779; 5,483,163; 5,483,158; 5,473,252; 5,461,314; 5,365,173; 5,243,286; 5,196,797; 5,185,575; 5,172,061; 5,159,929; 5,081,418; 4,926,125; 4,918,388; 4,885,539; 4,879,516; 4,871,969; 4,820,985; 4,788,503; 4,783,641; 4,780,677; 4,752,736; 4,751,464; 4,737,718; 4,731,584; 4,725,780; 4,721,915; 4,129,822; 4,320,342; and 4,638,253 respectively. The texts and figures of all these U.S. patents are expressly incorporated by reference herein.

A "Type I" RID circuit is configured to couple with a pair of array elements in such a manner that the flux from the pair of array elements induces current of opposing direction that compensates for both the reactive and resistive component of the mutual impedance between the pair of array elements.

A "Type II" RID circuit is configured to couple with a pair of array elements in such a manner that the flux from the pair of array elements induces current in the same direction that compensates for the reactive component of the mutual impedance between the pair of array elements while not compensating for the resistive component thereof.

The term "decoupling" refers to the process of eliminating a "crosstalk" or the energy transfer between two coupled antennas (such as array elements of a transceiver phased array) through the shared impedance $Z_{12}$. The efficiency of decoupling as applied to transmission is evaluated by measuring the transmission parameter $S_{12}$, which is directly related to the $Z_{12}$ value. In this sense, the resistive and reactive component of the $Z_{12}$ simply describes the amplitude and phase relationship of a signal propagating between ports of two coupled antennas. As applied to reception, the mutual resistance measured between two coupled antennas is often related to their noise correlation. See, for example, Roemer et al, *The NMR phased array*, 16 MAGN. RESON. MED. 192-225 (1990); and Wright, *Full-wave analysis of planar radiofrequency coils and coil arrays with assumed current distribution*, 15(1) CONC. MAGN. RESON. B: MAGN. RESON. ENG. 2-14 (2002).

FIG. 1 illustrates a transceiver phased array 100 with resonant inductive decoupling (RID) circuits 102 to cancel cross-talk among the array elements 104 according to an illustrative embodiment. The transceiver phased array 100 is shown, for illustration, as part of a magnetic resonance imaging (MRI) system 106. In an MRI system, a magnet 108 generates a generally uniform and static magnetic field (referred to as the $B_0$ magnetic field) along an axis of a sample 110. For MRI systems, the $B_0$ magnetic field is generally oriented along a longitudinal axis of the patient. The $B_0$ magnetic field causes the net summed nuclear spins of certain nuclei of the sample 110 to orient in a particular direction. The transceiver phased array 100 is a second separate RF antenna (RF coil) assembly that generates a varying magnetic field (commonly referred to as the $B_1$ magnetic field) perpendicularly to the $B_0$ magnetic field. The $B_1$ magnetic field varies at a frequency that is absorbed by certain nuclei within the sample 110 (commonly referred to as the "resonant frequency" or the "Larmor frequency") and is transmitted in pulses or bursts. The resonant frequency is typically in the radio-frequency range (e.g., between 3 Hz and 3 Ghz), and thus the $B_1$ magnetic field and the associated transmission components are generally referred to as RF, such as "RF magnetic field" and "surface RF coils." During a pulse, a portion of the $B_1$ magnetic field is absorbed by the sample 110, which causes certain nuclei to transition to a different energy state with a different orientation. After the pulse, the nuclei attempt to regain the previous orientation and concomitantly emit a different time-varying magnetic field, which is commonly referred to as a "resonance signal". The resonance signal is also in the RF range. The transceiver phased array 100 is a type of RF coil and includes multiple distinct and independent surface coils as the array elements 104. The array elements are configured as RF antenna that may operate as (i) a transmitter to generate the $B_1$ magnetic field at the resonant frequency and (ii) a receiver to receive the resonance signal. Interaction (or coupling) between the array elements of the transceiver phased array 100 is generally referred to as "cross-talk" and degrades the signal-to-noise performance of the array 100.

Each of the resonant inductive decoupling circuits 102 may include (i) two small inductors 122, 124 connected in series with the surface coils (i.e., array element 104) and (ii) an electrically insulated resonant coil 103 with a pair of windings 112, 114 coupled to each surface coil of the array elements 104. The electrically insulated resonant coil 103 may form two parallel loops 105, 107 in parallel with a capacitor 116. Capacitor 116 may comprise multiple capacitors in series or parallel to produce the desired capacitance $C_0$. The electrically insulated resonant coil produces a RF magnetic field which interacts with the magnetic flux from the array element to generate two currents 118, 120 (referred as $I_0$) in opposing directions in the parallel loops 105, 107. The pair of windings 112, 114 of the resonant inductive decoupling circuit 102 inductively couples to the small inductors 122, 124 of the array elements 104. Each of the resonant inductive decoupling circuits 102 may cancel the cross-talk between each pair of adjacent array elements 104 by compensating for both the reactive $X_{12}$ and resistive components $R_{12}$ of the mutual impedance $Z_{12}$ between each pair of array elements 104 and not disturbed the RF magnetic field of the array elements 104.

The inventors have realized that to cancel the cross-talk and not disturb the RF magnetic field of the array elements, the resonant inductive decoupling circuit 102 must satisfy two requirements. First, the resonant frequency of the resonant inductive decoupling circuit 102 has to be sufficiently lower than the resonant frequency of the array elements 104 to minimize the interactions between the resonant inductive decoupling circuit 102 and the array elements 104. The interaction relates to the changing frequency dependence of current $I_1$, $I_2$ in the array elements 104 and the RF magnetic field generated by the resonant inductive resonant circuit 102. To produce a sufficiently large difference between the resonant frequencies of the resonant inductive decoupling circuit and the resonant frequency of the array elements (frequency shift), the coupling between the array elements 104 and the resonant inductive decoupling circuit 102 has to be sufficiently large. Second, all inductors forming RID circuits have to be physically small to not add to, thereby changing or distorting, the $B_1$ magnetic field of the array elements 104.

In the presence of a sample, the mutual impedance $Z_{12}$ may include a substantial resistive component $R_{12}$ due to common current paths between the pair of array elements within the sample. It has been shown that adjacent overlapped surface coils under loading can generate substantial mutual resistance $R_{12}$. See, for example, Roemer et al, *The NMR phased array*, 16 MAGN. RESON. MED. 192-225 (1990); and Wright, *Full-wave analysis of planar radiofrequency coils and coil arrays with assumed current distribution*, 15(1) CONC. MAGN. RESON. B: MAGN. RESON. ENG. 2-14 (2002).

In FIG. 1, the transceiver phased array 100 is shown with sixteen non-overlapping array elements arranged in a single row where each of the array elements 104 overlaps with a neighboring array element. Of course, additional rows may be employed that are non-overlapping or overlapping, and each of the array elements 104 may overlap with more than one neighboring array element. The array elements 104 are organized in a unified assembly and are collectively positioned as an aggregate in a pre-defined arrangement. In the transceiver phased array, loops of the RF current may be normally positioned parallel to the surface of the array holder which circumscribes the sample. This orientation of the array elements has been demonstrated to minimize the mutual inductive coupling between elements of the array and simplifies the decoupling by limiting the significant coupling to only adjacent elements. See, for example, Tropp, *Mutual Inductance in the Bird-Cage Resonator*, 126 J. MAGN. RESON. 9-17 (1997).

Figure 2:
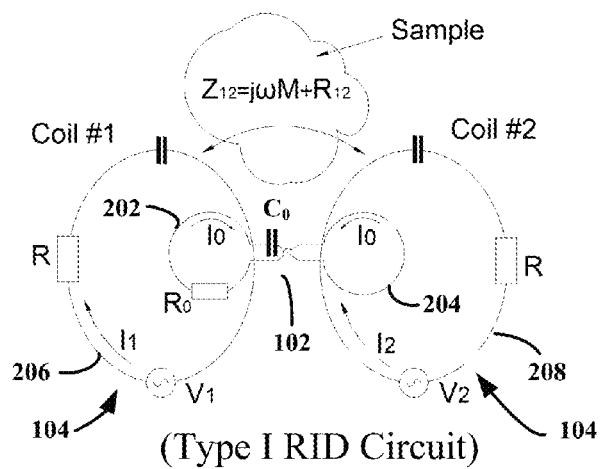
FIG. 2 is an electrical diagram showing a resonant inductive decoupling circuit inductively coupled to a pair of array elements.

FIG. 2 is an electrical diagram showing a resonant inductive decoupling circuit 102 inductively coupled to a pair of array elements 104 according to the illustrative embodiment. The resonant inductive decoupling circuit 102 may be modeled as a circuit with two loops 202, 204 in a "butterfly configuration" that produce two opposite currents $I_0$. This topology of resonant inductive resonant circuit 102 may be referred as a "Type I RID circuit." The resonant inductive decoupling circuit 102 has a resistance $R_0$ and a capacitance $C_0$. The loops 202, 204 inductively couple to corresponding surface coils 206, 208 of the array elements 104 (labeled as "Coil#1" and "Coil#2"). The surface coil 206 is modeled as a circuit with resistance R and inductance L that produces current $I_1$ when voltage $V_1$ is applied. Similarly, the surface coil 208 is modeled as a circuit with resistance R that produces a current $I_2$ when voltage $V_2$ is applied. The mutual impedance $Z_{12}$ between the surface coil 206 and surface coil 208 may be expressed as $Z_{12}=j\omega M+R_{12}$ where $j\omega M$ refers to the reactive component and $R_{12}$ refers to the resistive component.

Equation 1 is the Kirchhoff equation of the three-circuit resonant system shown in FIG. 2.

$$\begin{pmatrix} V_1 \\ 0 \\ V_2 \end{pmatrix} = \begin{pmatrix} Z_1 & j\omega_L M_0 & -j\omega_L M + R_{12} \\ j\omega_L M_0 & Z_0 & -j\omega_L M_0 \\ -j\omega_L M + R_{12} & -j\omega_L M_0 & Z_2 \end{pmatrix} \begin{pmatrix} I_1 \\ I_0 \\ I_2 \end{pmatrix} \quad \text{(Equation 1)}$$

$Z_0$ is the impedances of the RID circuit, and $Z_1$ and $Z_2$ are the corresponding impedance of the pair of array elements 104. $M_0$ is the mutual inductance between the RID circuit 102 and the array elements 104. For simplicity, the mutual inductance $M_0$ may be assumed to be equal for each of the array elements 104 and the RID circuit 102. $\omega_L$ is the resonance frequency of the array elements 104, which may be assumed to be the same among the array element 104 that form transceiver phased array 100.

As shown in Equation 1, the two currents 118, 120 (see FIG. 1) of the RID circuit 102 are opposite in direction. Specifically, the second element in the first row of Equation 1 ($j\omega_L M_0$) and the third element in the second row ($-j\omega_L M_0$) have opposite signs. Same relationship is observed for the first element in the second row and the second in the third row.

Solving for $V_1$ and $V_2$ of Equation 1 yields Equation 2.

$$\begin{pmatrix} V_1 \\ V_2 \end{pmatrix} = \quad \text{(Equation 2)}$$

$$\begin{pmatrix} Z_1 + \frac{\omega_L^2 M_0^2}{Z_0} & -(j\omega)_L M + R_{12} - \frac{\omega_L^2 M_0^2}{Z_0} \\ -j\omega_L M + R_{12} - \frac{\omega_L^2 M_0^2}{Z_0} & Z_2 + \frac{\omega_L^2 M_0^2}{Z_0} \end{pmatrix} \begin{pmatrix} I_1 \\ I_2 \end{pmatrix}$$

Near the resonance, $Z_0$ may be approximated as $Z_0 \approx 2jL_0 (\omega_L - \omega_0) + R_0 = 2jL_{\theta A}\omega + R0$, where $\omega_0$ is the resonance frequency of the decoupling circuit and $L_0$ and $R_0$ are its inductance and resistance. To cancel the mutual impedance $Z_{12}$, the quantity $$-j\omega_L M + R_{12} - \frac{\omega_L^2 M_0^2}{Z_0}$$

may be obtained from the off-diagonal elements of Equation 2. The quantity may be calculated as Equation 3, where R and L are the resistance and the inductance of the surface coils, and $Q_0=\omega L_0/R_0$ and $Q=\omega L/R$ are corresponding Q-factors of the RID circuit 102 and the array elements 104.

$$-j\omega_L M + R_{12} - \frac{\omega_L^2 M_0^2}{Z_0} \approx \qquad \text{(Equation 3)}$$

$$-j\omega_L kL + R_{12} - \frac{\omega_L^2 M_0^2 (R_0 - 2j\omega_L L_0)}{R_0^2 + 4(\Delta\omega_L)^2 L_0^2} \approx \approx$$

$$-j\omega_L kL + R_{12} - \frac{\omega_L^2 k_0^2 LL_0 (R_0 - 2j\omega_L L_0)}{4(\Delta\omega_L)^2 L_0^2} =$$

$$-j\omega_L L\left(k - \frac{k_0^2}{2\xi}\right) + R_{12} - \frac{R}{4}\frac{k_0^2}{\xi^2}\frac{Q}{Q_0}$$

The relative frequency difference between $\omega_L$ and $\omega_0$ (i.e., frequency shift) is expressed in Equation 4.

$$\xi=\Delta\omega/\omega_L \qquad \text{(Equation 4)}$$

Equation 3 accounts for $M_0=k_0(LL_0)^{1/2}$ and $M=kL$, where k and $k_0$ are corresponding coupling coefficients between array elements 104 and between an array element 104 and the RID circuit 102. For simplicity, R, L, and Q may be assumed to be the same for the pair of array elements 104. From Equation 3, the resonant inductive decoupling circuit 102 cancels both the real $R_{12}$ and imaginary $M_{12}$ components of the mutual impedance $Z_{12}$ when $\Delta\omega>0$, which occurs when $\omega_0<\omega_L$. To cancel the mutual reactance, Equation 5 has to be satisfied.

$$k_0^2=2k\xi \qquad \text{(Equation 5)}$$

To cancel the mutual impedance $Z_{12}$, the resonant frequency of the resonant inductive decoupling circuit 102 has to be relatively different by $\xi$ of Equation 6. $\xi$ is typically greater than 0.1 (i.e., 10%) to not produce distortions to the RF magnetic field of the surface coils within the sample. Of course, lower values of $\xi$ (e.g., more than 0.05) may be tolerated in applications where cross-talk is more tolerable.

$$\xi = \frac{k}{2\eta}\frac{Q}{Q_0} \qquad \text{(Equation 6)}$$

Additionally, the coupling between each of the inductors 112, 114 of the RID circuit 102 and the corresponding inductors 122, 124 of the array elements 104 has to be sufficiently large (greater than 0.08) to provide for the frequency shift $\xi$ of greater than 10% to not distort the RF field of the array elements. The condition for the coupling coefficient $k_0$ is provided in Equation 7.

$$k_0 = k\sqrt{\frac{Q_0}{\eta Q}} \qquad \text{(Equation 7)}$$

$\eta$ is a ratio of $R_{12}/R$. As a result, by varying the coupling coefficient $k_0$ and the relative frequency shift $\xi$, the resonant inductive decoupling circuit 102 may cancel both the real $R_{12}$ and the imaginary $X_{12}$ components of mutual impedance $Z_{12}$ between a pair of array elements 104.

Figure 3:
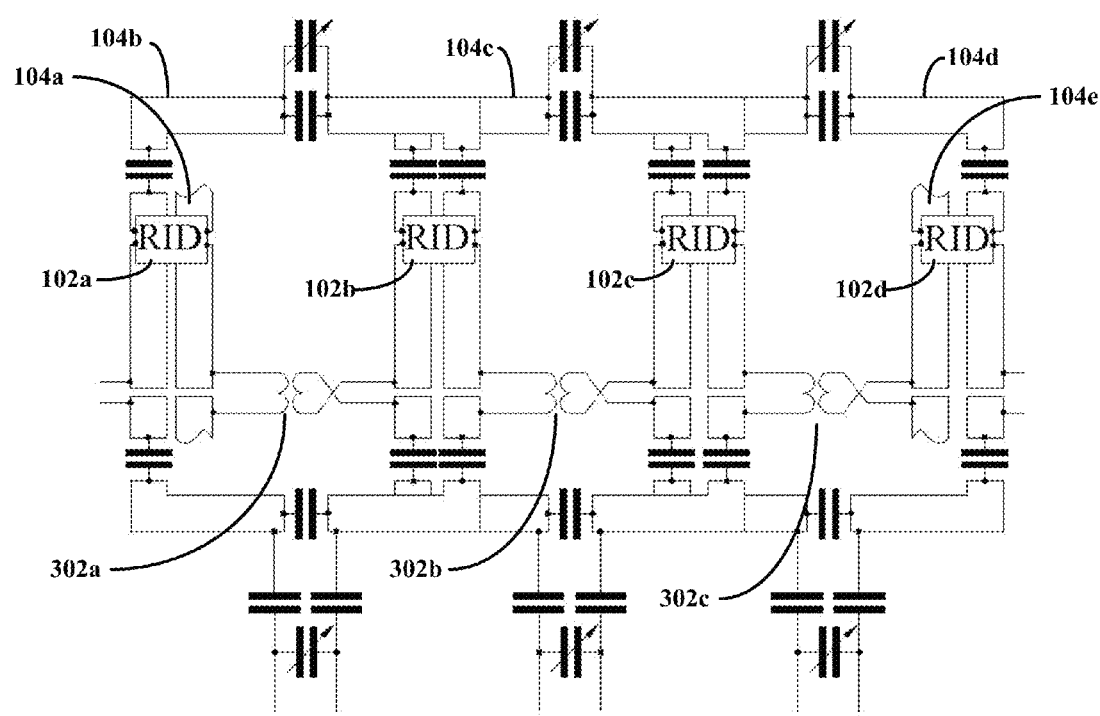
FIG. 3 is an electrical schematic of a transceiver phased array with resonant inductive decoupling circuits according to an embodiment.

FIG. 3 is an electrical schematic of the transceiver phased array 100 with overlapping array elements 104a, 104b, 104c, 104d, 104e. The figure illustrates the transceiver phased array 100 with resonant inductive decoupling circuits 102a, 102b, 102c, 104d configured to decouple pairs of adjacent array elements (pair 1: 104a and 104b; pair 2: 104b and 104c; pair 3: 104c and 104d, and pair 4: 104d and 104e). An array element 104 must be formed of a non-magnetic material, such as copper, linked by tuning capacitors to provide a desired resonant frequency. In addition to the decoupling network, the figure also shows the matching network of the individual array elements A separate common inductive decoupling circuit 302a, 302b, 302c is employed between non-adjacent array elements to cancel the mutual impedance therebetween (e.g., between array elements 104a and 104c, between array elements 104b and 104d, and between array elements 104c and 104e). Of course, the resonant inductive decoupling circuit 102 may be employed between the non-adjacent array elements to cancel the mutual impedance.

Figure 4A:
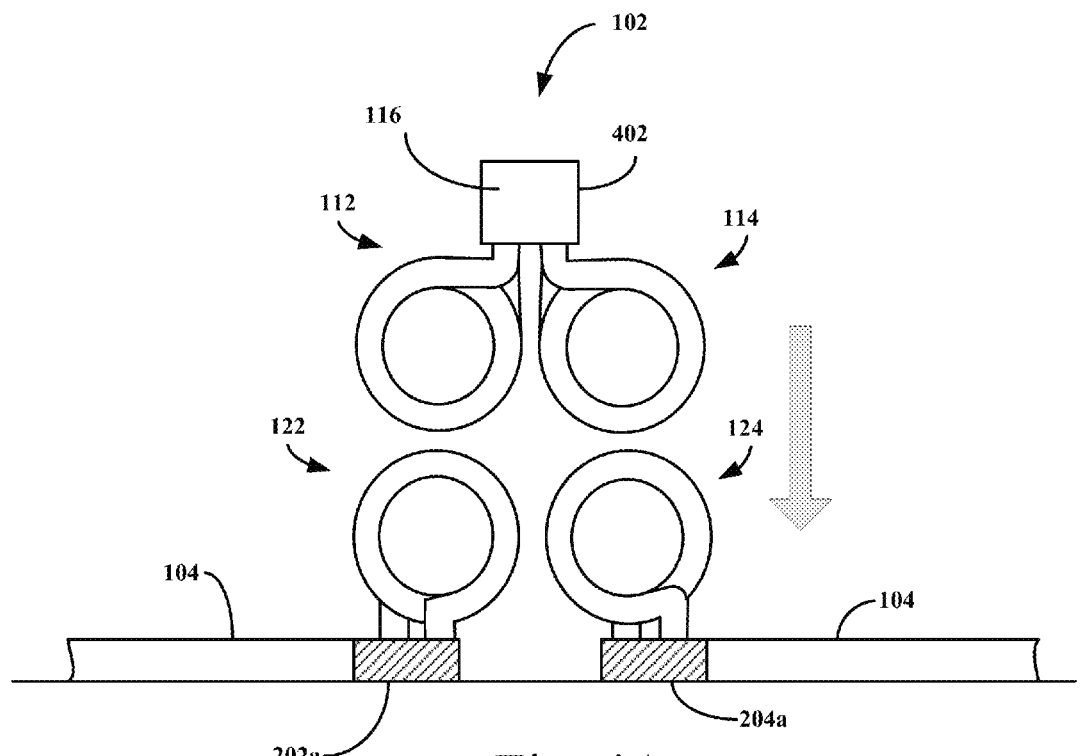
FIGS. 4A and 4B schematically illustrate a resonant inductive decoupling circuit according to the illustrative embodiment.
Figures 4B, 4C:
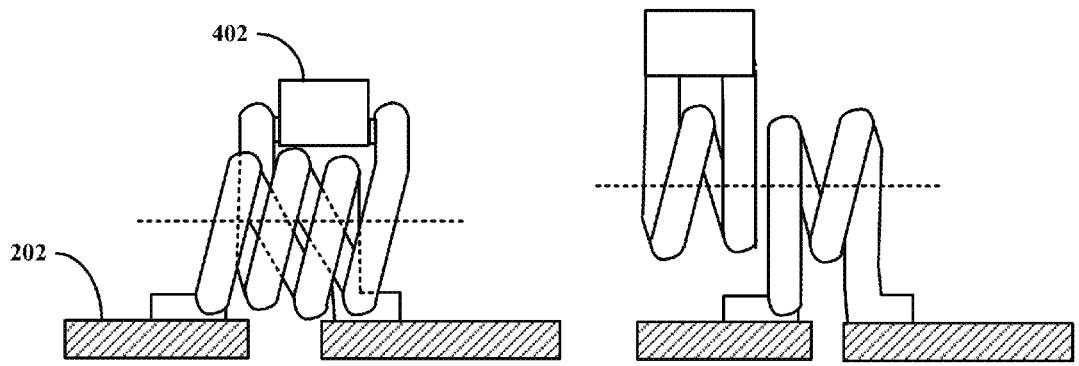
FIG. 4C schematically illustrates an alternative arrangement of the resonant inductive decoupling circuit of FIG. 4A.

FIGS. 4A and 4B schematically illustrate a resonant inductive decoupling circuit 102 according to the illustrative embodiment. FIG. 4A shows the front view of the RID circuit 102, and FIG. 4B shows the side view. The resonant inductive decoupling circuit 102 includes inductors 112, 114 that may be formed of turned-loops having two to four windings. It is determined that at higher resonant frequency (i.e., above 170 MHz), each of the inductors 112, 114, 122, 124 may be formed with two-turned loops. At lower resonant frequency, more loops may be employed. For example for a 4T MRI system operating at 170 MHz or a 3T MRI system operating at 125 MHz, the inductors 112, 114, 122, 124 may be formed with three or four-turned windings.

The inductors 112, 114 form two parallel circuit loops joined by a capacitor 116 that may be mounted in a housing 402. The housing 402 may provide a structural member for the inductors 112, 114 to mount. The RID circuit 102 is configured to inductively couple to inductors 122, 124 of the array elements 104. The inductors 112, 114 of the RID circuit 102 and the inductors 122, 124 of the array elements 104 may be configured to interleave among each other.

FIG. 4C schematically illustrates an alternative arrangement of the resonant inductive decoupling circuit 102 of FIG. 4A. Rather than being interleaved, the inductors 122, 124 of the array elements 104 may be positioned alongside the inductors 112, 114 of the RID circuit 102. The axis of the coils of the inductors 122, 124 may align with the axis of the inductors 112, 114. This embodiment may provide a lower coupling coefficient $k_0$ value, but may be more convenient to layout. Of course, it should be appreciated that the inductors 112, 114 of the RID circuit 102 and the inductors 122, 124 of the array elements 104 may partially interleave among each other.

Figure 4D:
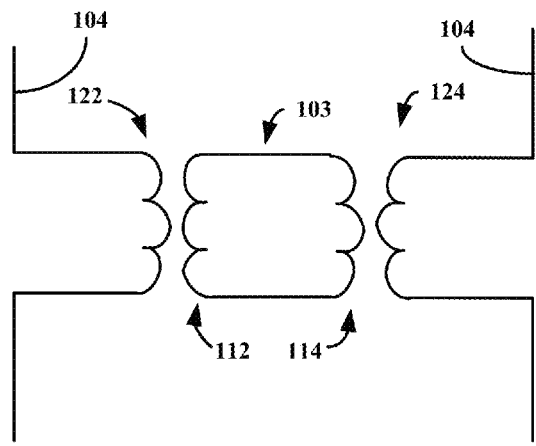
FIG. 4D schematically illustrates a layout of components of a resonant inductive decoupling circuit according to an embodiment.

FIG. 4D schematically illustrates a layout of components of a resonant inductive decoupling circuit according to an embodiment. The capacitor 116 of the electrically insulated resonant coil 103 is not shown for simplicity. The inductors 112, 114 of the electrically insulated resonant coil 103 are interleaved with the inductors 122, 124 of the array elements 104. The axis of the inductors 112, 114 may substantially align with the axis of the inductors 122, 124.

Figure 4E:
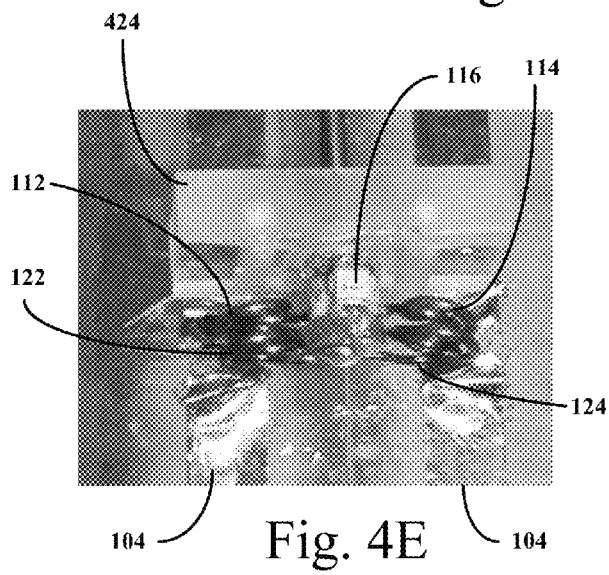
FIGS. 4E and 4F are photographs of a resonant inductive decoupling circuit of FIG. 4D.
Figure 4F:
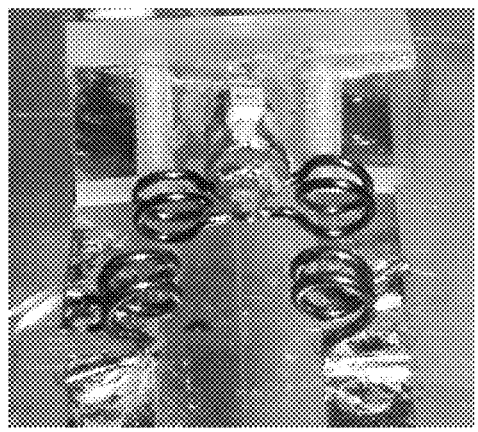

FIGS. 4E and 4F are photographs of a resonant inductive decoupling circuit 102 of FIG. 4D according to an illustrative embodiment. In FIG. 4E, the resonant inductive decoupling circuit 102 includes a variable capacitor 116 that connects in parallel with two loops 112, 114, each having an inductor. The two loops 112, 114 interleave with the two inductors 122, 124 that are formed as part of the array elements 104. FIG. 4F shows the resonant inductive decoupling circuit 102 unassembled with respect to the inductors 122, 124 of the array elements.

Figure 4G:
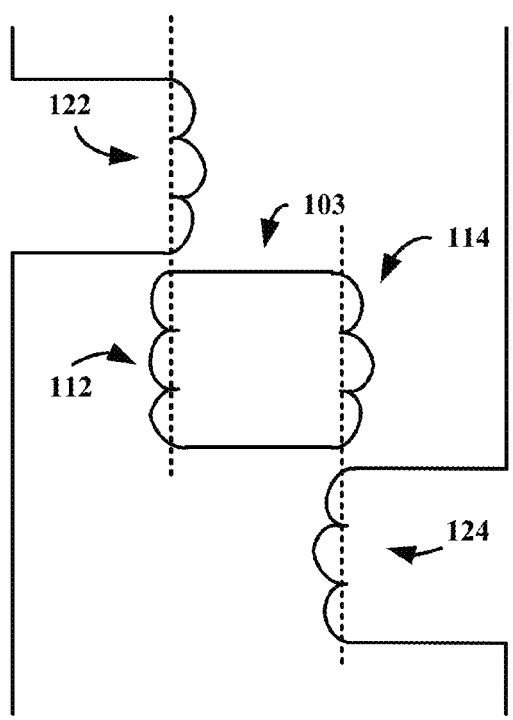
FIGS. 4G-4H schematically illustrate layouts of components of a resonant inductive decoupling circuit according to an alternate embodiment.
Figure 4H:
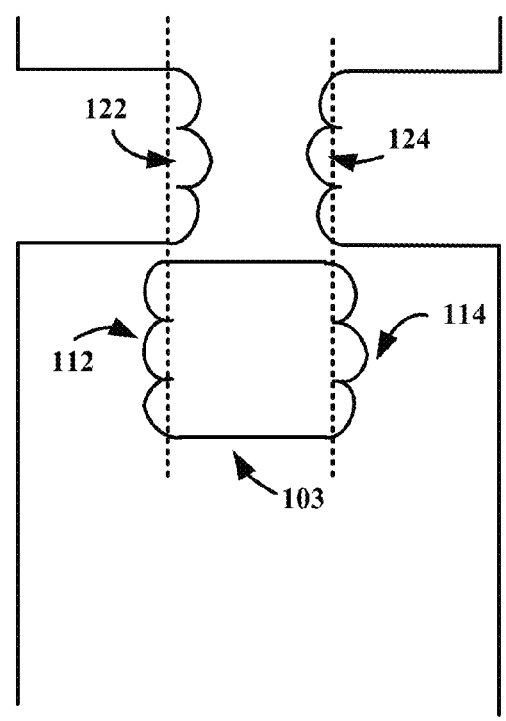

FIGS. 4G-4H schematically illustrate layouts of components of a resonant inductive decoupling circuit according to an alternate embodiment. In FIG. 4G, the inductors 112, 114 of the electrically insulated resonant coil 103 are positioned alongside the inductors 122, 124 of the array elements 104. The axis of the inductors 112, 114 may substantially align with the axis of the inductors 122, 124. The inductor 122 and inductor 124 may be positioned on opposite sides of the electrically insulated resonant coil 103. Alternatively, as shown in FIG. 4H, the inductor 122 and inductor 124 may be positioned on the same side in relation to the electrically insulated resonant coil 103.

It should be appreciated that the electrically insulated resonant coil 103, as shown in FIGS. 4D, 4G, and 4H, illustrates its layout in relation to the inductors 122, 124 of the array elements 104. As such, details of the circuitry of the electrically insulated resonant coil 103, including the capacitor 116, are not shown.

In an embodiment, the RID circuit 102 may be constructed having a 3 mm (millimeter) inner diameter using 20-gauge (i.e., diameter of 0.8 mm) magnet wires. Of course, other wire size and dimensions may be employed to provide a coupling coefficient $k_0$ greater than 0.08. The surface coils of the array elements 104 may be formed using 5 mm copper tape and form an overlap of 12 mm among the array elements 104.

In such a configuration, the proximity of the next nearest array element (i.e. $\Delta n=2$) resulted in mutual inductive coupling of ~5 nH (k~0.03). This coupling was eliminated by the use of conventional non-resonant inductive decoupling as shown in FIG. 3 and described in Avdievich et al, *Short Echo Spectroscopic Imaging of the Human Brain at 7T Using Transceiver Arrays*, 62 MAGN. RES. MED. 17-25 (2009); and Avdievich, *Transceiver phased arrays for human brain studies at 7T*, 41(2) APPL. MAGN. RESON. 483-506 (2011), which are incorporated by reference herein in their entirety. To decrease radiation losses, a shield (50 µm polyamide film with a 5 µm copper layer, Sheldahl, Northfield, Minn.) was placed 4 cm away from the array elements 104. See, for example, Harpen, *Radiative losses of a birdcage resonator*, 29(5) Magn Reson Med. 713-716 (1993), which is incorporated by reference herein in its entirety.

Figure 4I:
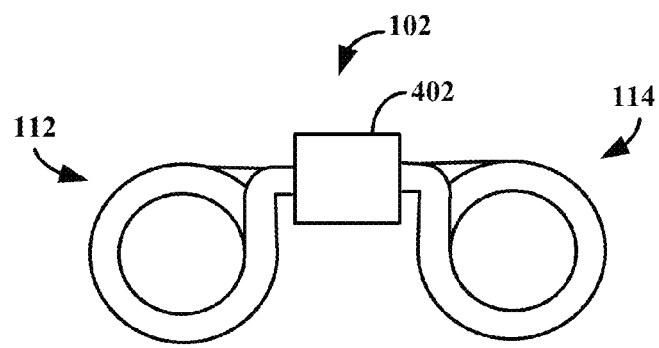
FIG. 4I shows the front view of a resonant inductive decoupling circuit according to another embodiment.

FIG. 4I shows the front view of a RID circuit according to another embodiment. Rather than inductors 112, 114 mounting to the bottom of the housing 402, the inductors 112, 114 mount to the side of the housing 402.

In order for the magnetic fluxes generated by adjacent array elements to produce voltages of opposite sign in the RID circuit loops, as provided in Equation 2, all four inductors 112, 114, 122, 124 should be wound in appropriate directions where (i) two of the four inductors are wound clockwise and the other two inductors are wound counter-clockwise or (ii) all of the inductors are wound in the same direction. The various winding orientations of the four inductors are provided in Table 1.

TABLE 1

Topology of RID Circuit shown in FIG. 1

| | Inductor | | | |
|---|---|---|---|---|
| | Inductor 122 (Array Element 1) | Inductor 112 (RID Circuit) | Inductor 114 (RID Circuit) | Inductor 124 (Array Element 2) |
| Winding Direction | Clockwise | Clockwise | Counter-clockwise | Counter-clockwise |

TABLE 1-continued

Topology of RID Circuit shown in FIG. 1

| Inductor | | | |
|---|---|---|---|
| Inductor 122 (Array Element 1) | Inductor 112 (RID Circuit) | Inductor 114 (RID Circuit) | Inductor 124 (Array Element 2) |
| Clockwise | Counter-clockwise | Clockwise | Counter-clockwise |
| Clockwise | Counter-clockwise | Counter-clockwise | Clockwise |
| Counter-clockwise | Clockwise | Clockwise | Counter-clockwise |
| Counter-clockwise | Clockwise | Counter-clockwise | Clockwise |
| Counter-clockwise | Counter-clockwise | Clockwise | Clockwise |
| Clockwise | Clockwise | Clockwise | Clockwise |
| Counter-clockwise | Counter-clockwise | Counter-clockwise | Counter-clockwise |

As indicated, to construct an RID circuit 102 that does not disturb the $B_1$ magnetic field of the array elements, the resonant frequency $\omega_0$ of the RID circuit 102 has to be sufficiently apart from the resonant frequency $\omega_L$ of the array elements 104 (i.e., $\omega_0 < \omega_L$), and the RID circuit 102 has to be physically small in size. To satisfy both conditions, the coupling coefficient $k_0$ has to be sufficiently large, as both factors depend on $k_0$, as provided in Equations 5 and 6.

Figure 4J:
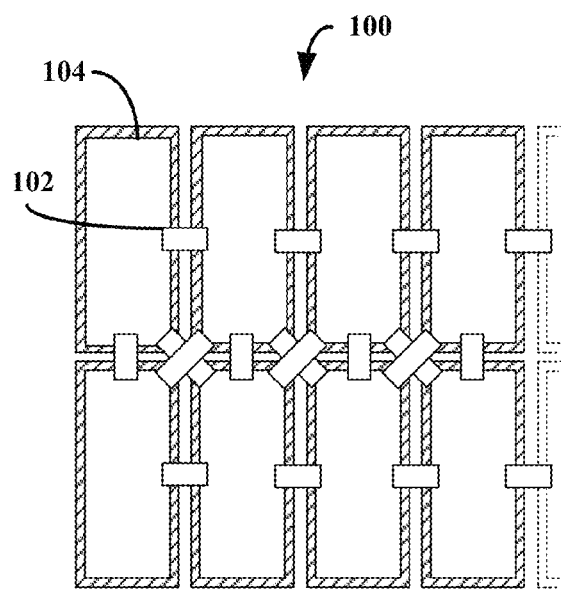
FIG. 4J illustrates a layout of a 2×4 transceiver phased array decoupled with resonant inductive decoupling circuits according to the illustrative embodiment.

FIG. 4J illustrates a transceiver phased array decoupled with the resonant inductive decoupling circuit 102 according to the illustrative embodiment. In the figure, the transceiver phased array 100 includes two rows of four array elements 104. A resonant inductive decoupling circuit 102 is employed between each of the adjacent array elements 104. As shown, 18 RID circuits are employed for the 2×4 array. It should be appreciated that the various embodiments may be applied to transceiver phased arrays having other numbers of array elements using appropriate numbers of RID. For example, the addition of four-elements to each row (i.e., 16-coil array arranged as a 2×8 array) increases the number of neighboring pairs to 40. The addition of a third-row of eight elements (i.e., 24-coil array arranged as a 3×8 array) increases the number of neighboring pairs to 72. For a 32-coil array having a 4×8 arrangement, 104 RID circuits may be employed.

Figure 4K:
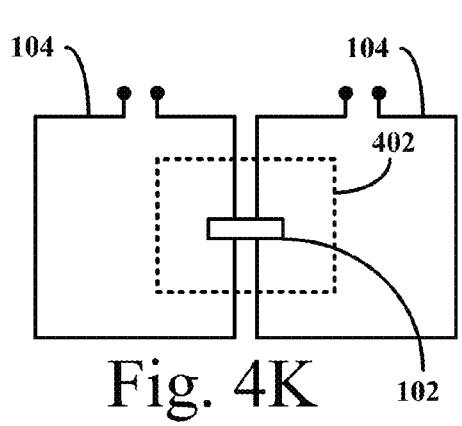
FIG. 4K is a diagram illustrating the resonant inductive decoupling circuit decoupling a pair of non-overlapping array elements.
Figure 4L:
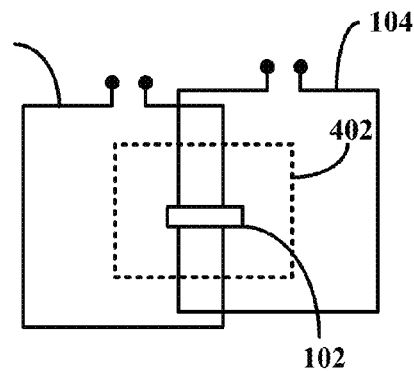
FIG. 4L is a diagram illustrating the resonant inductive decoupling circuit decoupling a pair of overlapping array elements.
Figure 6A:
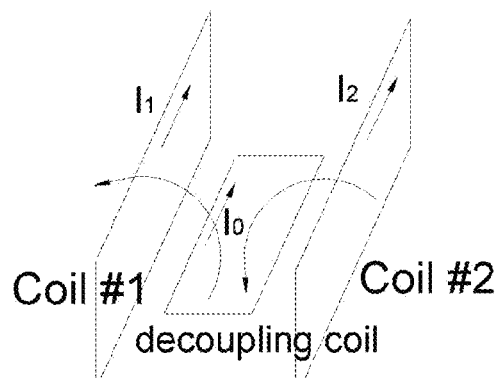
FIGS. 6A-6C illustrate other alternate resonant inductive decoupling circuits.
Figure 6B:
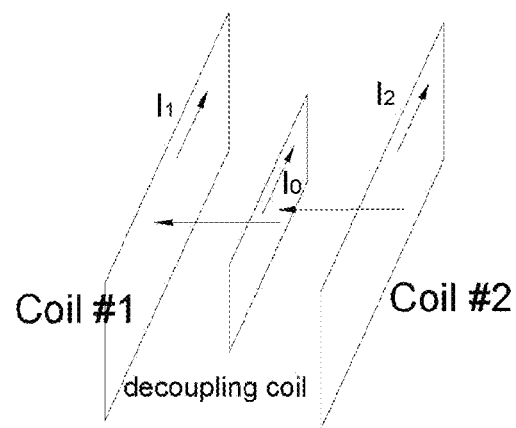
Figure 6C:
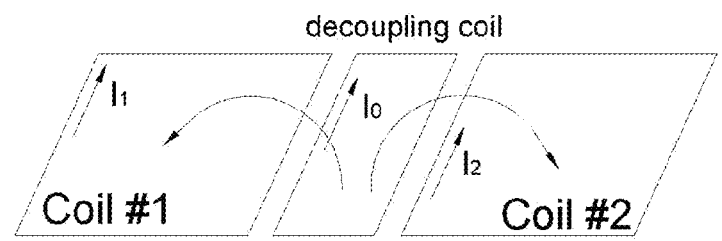

The resonant inductive decoupling circuit 102 may be employ to decouple overlapping or non-overlapping array elements 104. FIG. 4K is a diagram illustrating the resonant inductive decoupling circuit 102 decoupling a pair of non-overlapping array elements 104. FIG. 4L is a diagram illustrating the resonant inductive decoupling circuit 102 decoupling a pair of overlapping array elements 104. The relevant portion of the resonant inductive decoupling circuit 102 of FIGS. 1 and 6 are shown in the dotted-line box 402.

Figure 4M:
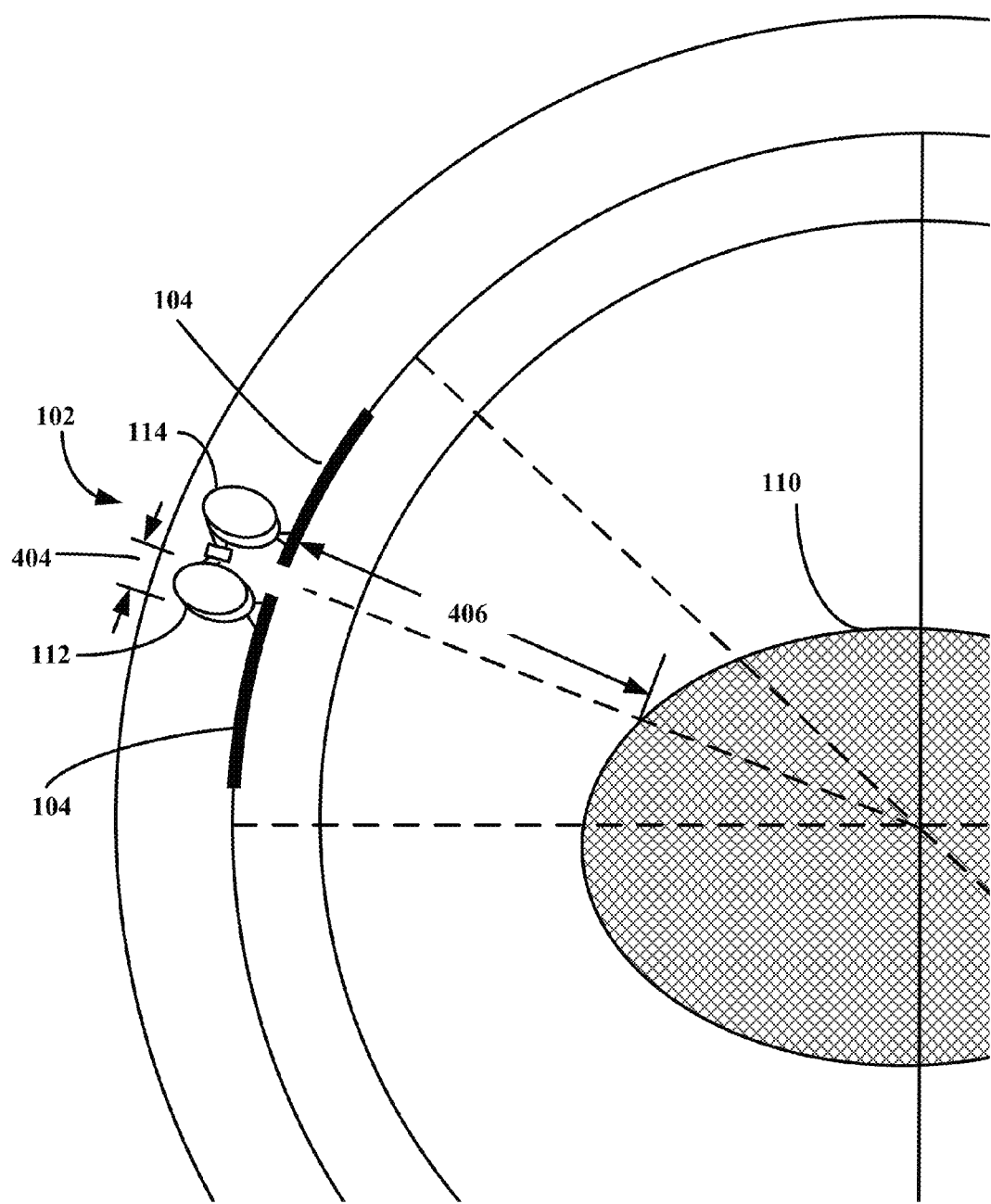
FIG. 4M is a diagram of a pair of array element and a resonant inductive decoupling circuit in relation to a sample.

FIG. 4M is a diagram of a pair of array element 104 and a resonant inductive decoupling circuit 102 in relation to a sample 110. As indicated, the resonant inductive decoupling circuit 102 should be sufficiently small to not cause distortions to the $B_1$ magnetic field of the array elements. To satisfy the size constraints, the size 404 of the inductors 112, 114 may be less than 30 percent of the distance 406 between the array elements 104 and the sample 110.

Performance Comparison to Other RID Circuits

Through experimentation, it is observed that in spite of being much smaller in size, the RID circuits 102 according to the illustrative embodiment have substantially larger $k_0$ values compared to other RID circuits known in the art. Table 2 provides the parameters of the RID circuit 102 of the present embodiment and parameters for other RID circuits.

TABLE 2

| Type | Inductor Size | $k_0$ | $f_0$, MHz | $\xi$ | $Q_0$ |
|---|---|---|---|---|---|
| Type I RID Circuit | Dia. 4 mm | 0.14 | 259 | 0.13 | 300 |
| Topology 1 | Dia. 16 mm | 0.05 | 293 | 0.017 | 280 |
| Topology 1 | Dia. 22 mm | 0.06 | 289 | 0.03 | 325 |
| Topology 1 | Dia. 28 mm | 0.09 | 280 | 0.064 | 440 |
| Topology 2 | 15 × 60 mm | 0.06 | 288 | 0.034 | 380 |
| Topology 3 | 20 × 20 mm | 0.04 | 294 | 0.013 | 400 |

Figure 5A:
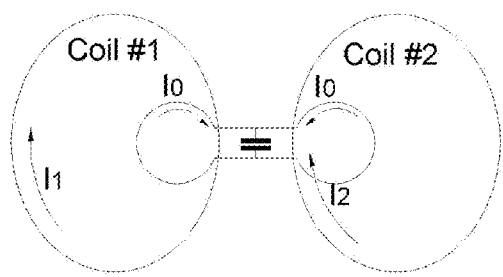
FIGS. 5A-5C illustrate alternate resonant inductive decoupling circuits.
Figure 5B:
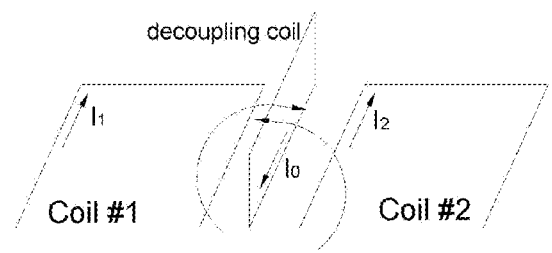
Figure 5C:
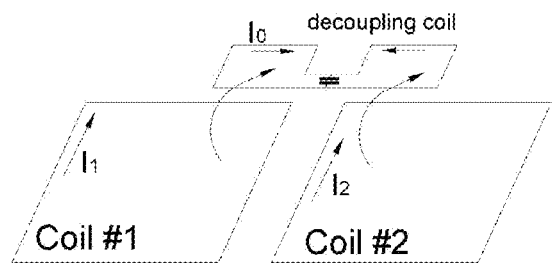

FIGS. 5A-C and FIGS. 6A-6C demonstrate several examples of resonant inductive decoupling circuits known in the art. Specifically, FIG. 5A is a diagram of a Topology 1 RID circuit, of Table 3, described in Aal-Braij et al, *A novel inter-resonant coil decoupling technique for parallel imaging*, Proceedings of the 17th Annual Meeting ISMRM, Honolulu, USA, 2974, (2009). FIG. 5B is a diagram of a Topology 2 RID circuit described in Soutome et al, *Vertical Loop Decoupling Method for Gapped Phased-Array Coils*, Proceedings of the 19th Annual Meeting ISMRM, Montreal, Canada, 1859 (2011). FIG. 5C is a diagram of a Topology 3 RID circuit according to an alternate embodiment.

Alternative Embodiment of Type I RID Circuit

Figure 7:
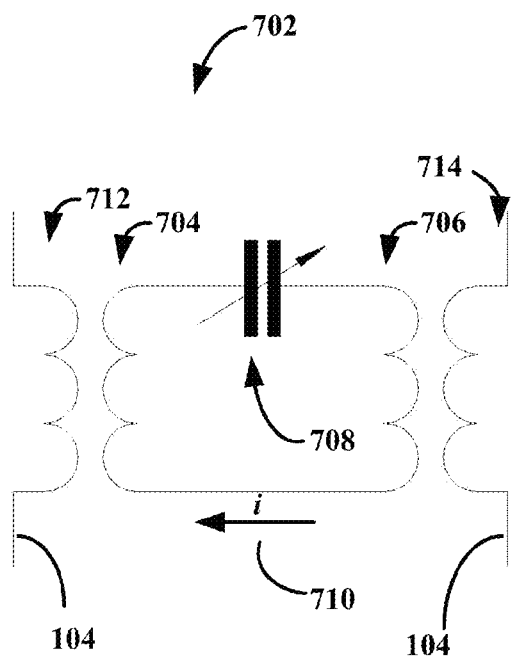
FIG. 7 illustrates a resonant inductive decoupling circuit according to an alternate embodiment.

FIG. 7 illustrates a resonant inductive decoupling (RID) circuit 702 according to an alternate embodiment. The resonant inductive decoupling circuit 702 includes two inductors 704, 706 that form a single loop in series with a capacitor 708 to generate a single current 710. The inductors 704, 706 couple to inductors 712, 714 formed in each of the array elements 104. The orientation of the inductors 704, 706, 712, 714 may be wounded such that the fluxes generated by adjacent array elements produces voltages of opposing sign in the RID circuit, thereby generating two opposing currents in the single loop of the resonant inductive decoupling circuit 702.

To do so, all four inductors 704, 706, 712, 714 should be wound in appropriate directions where at least one of the inductors is wound differently from the other three inductors. The various winding orientations of the four inductors are provided in Table 2.

TABLE 2

Topology of RID Circuit (Type I) shown in FIG. 7

| | Inductor | | | |
|---|---|---|---|---|
| | Inductor 122 (Array element 1) | Inductor 112 (RID Circuit) | Inductor 114 (RID Circuit) | Inductor 124 (Array Element 2) |
| Winding Direction | Clockwise | Counter-clockwise | Counter-clockwise | Counter-clockwise |
| | Counter-clockwise | Clockwise | Counter-clockwise | Counter-clockwise |
| | Counter-clockwise | Counter-clockwise | Clockwise | Counter-clockwise |
| | Counter-clockwise | Counter-clockwise | Counter-clockwise | Clockwise |
| | Counter-clockwise | Clockwise | Clockwise | Clockwise |
| | Clockwise | Counter-clockwise | Clockwise | Clockwise |

TABLE 2-continued

Topology of RID Circuit (Type I) shown in FIG. 7

| | Inductor | | | |
|---|---|---|---|---|
| | Inductor 122 (Array element 1) | Inductor 112 (RID Circuit) | Inductor 114 (RID Circuit) | Inductor 124 (Array Element 2) |
| | Clockwise | Clockwise | Counter-clockwise | Clockwise |
| | Clockwise | Clockwise | Clockwise | Counter-clockwise |

Type II RID Circuit

Figure 8:
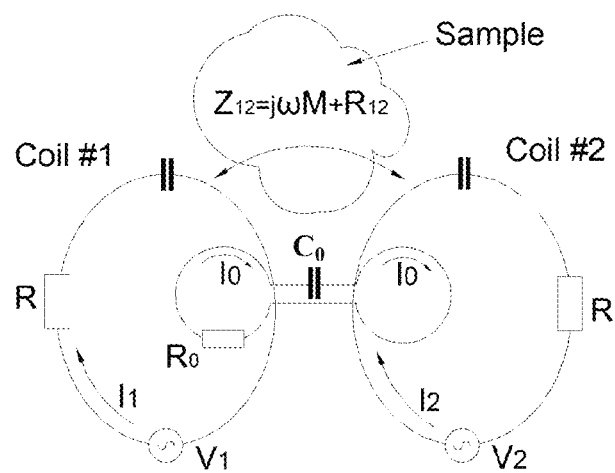
FIG. 8 is a diagram of a resonant inductive decoupling circuit, which compensates only for the mutual reactance and not the mutual resistance.

When wound differently (i.e., having even numbers of the clock-wise and counter-wise inductors), the resonant inductive decoupling (RID) circuit of FIG. 7 may be configured as "a Type II RID Circuit." In a Type I RID circuit (shown in FIG. 2), the array elements generate magnetic fluxes that produce voltages of opposite sign. However, in the Type II RID circuit, the array elements generate magnetic fluxes that produce voltages of the same sign in the RID circuit. FIG. 8 is an electrical diagram showing the Type II resonant inductive decoupling circuits when wound with an even number of clock-wise and counter-wise inductors. The solved Kirchhoff equations of the Type II resonant inductive decoupling circuit is shown in Equation 8.

$$\begin{pmatrix} V_1 \\ V_2 \end{pmatrix} = \begin{pmatrix} Z_1 + \frac{\omega_L^2 M_0^2}{Z_0} & -j\omega_L M + R_{12} + \frac{\omega_L^2 M_0^2}{Z_0} \\ -j\omega_L M + R_{12} + \frac{\omega_L^2 M_0^2}{Z_0} & Z_2 + \frac{\omega_L^2 M_0^2}{Z_0} \end{pmatrix} \begin{pmatrix} I_1 \\ I_2 \end{pmatrix} \quad \text{(Equation 8)}$$

Solving for the off-diagonal elements for a Type II RID circuit of Equation 8 yields Equation 9.

$$-j\omega_L L\left(k + \frac{k_0^2}{2\xi}\right) + R_{12} + \frac{R}{4}\frac{k_0^2}{\xi^2}\frac{Q}{Q_0} \quad \text{(Equation 9)}$$

Therefore, the reactive component of the $Z_{12}$ can be cancelled when $\Delta\omega<0$, which occurs when $\omega_0>\omega_L$. As indicated, the array elements generate magnetic fluxes that produce voltages of the same sign in the Type II RID circuit. This is shown in Equation 8. As such, the inductors of the Type II RID circuit may only add to the $R_{12}$ since both resistive components have the same sign. Nevertheless, the mutual inductance is eliminated when $k_0^2=-2k\xi$. Thus, the Type II RID circuit may also be used for compensating for the mutual reactance between a pair of array elements by satisfying the condition, $\xi<0$, which occurs when $\omega_0>\omega_L$. Here, $\xi$ should also be sufficiently large so as to not increase the resistive coupling. This can be achieved if the RID circuit has a sufficiently large coupling coefficient $k_0$. The Type II RID circuit may be employed to decouple a transceiver phased array where the resistive component is small and can be neglected thus requiring only minimization of the inductive (i.e. reactive) coupling.

Q-Factor and Voltage Estimation

Currents induced in the inductors of the resonant inductive decoupling circuit 102 may generate losses, which may spoil the unloaded Q-factor $Q_U$ of the array elements 104, which may affect the performance of the transceiver phased array 100. Changes in the $Q_U$ may be estimated from induced changes in the impedance values $Z_1$, $Z_2$ of the array elements 104 using Equations 2 and 8. The estimate may be expressed as $\Delta Z$, provided in Equation 10.

$$\Delta Z = \frac{\omega_L^2 M_0^2}{Z_0} \approx \frac{\omega_L^2 M_0^2}{4\Delta\omega^2 L_0^2}(R_0 - 2j\Delta\omega L_0) = \frac{k^2}{k_0^2}\frac{Q}{Q_0}R - jk\omega_L L \quad \text{(Equation 10)}$$

The new unloaded Q-factor QU' may be estimated as Equation 11.

$$Q'_U = Q_U \frac{1-k}{1+\frac{k^2}{k_0^2}\frac{Q}{Q_0}} \quad \text{(Equation 11)}$$

Additionally, the voltage generated across the capacitors 116, 708 within the resonant inductive decoupling circuit 102, 702 may be high and may be controlled by the values of the capacitors and their number. From Equation 1, the current $I_0$ for the Type I RID circuit may be expressed as Equation 12.

$$I_0 = \frac{j\omega M_0}{Z_0}(I_2 - I_1) \approx \frac{k_0}{2\xi}\sqrt{\frac{L}{L_0}}(I_2 - I_1) = \frac{k}{k_0}\sqrt{\frac{L}{L_0}}(I_2 - I_1). \quad \text{(Equation 12)}$$

In the case of equal current amplitudes (i.e. $I_1=I_2=I$), the amplitude of $$I_0 \approx \frac{k}{k_0}\sqrt{\frac{L}{L_0}}I\sin\varphi,$$

where $\varphi$ is the phase shift between $I_1$ and $I_2$.

Decoupling of Double-Tuned Transceiver Phased Arrays

The method described above can also be used to decouple double-tuned surface coils (i.e., array elements). Double-tuned (e.g. $^{31}$P/$^1$H) transceiver phased array is beneficial at super-high magnetic fields (>7T) for X-nuclei imaging and spectroscopy. See, for example, Avdievich, *Transceiver Phased Arrays for Human Brain Studies at 7T*, 41(2) Appl. Magn. Reson., 483-506 (2011). It drastically improved the coil transmit efficiency, the homogeneity, and the SNR at the higher $^1$H frequency in comparison with a double-tuned volume coil. At the same time, the phased array is observed to provided substantially better, in some instances up to four times, peripheral SNR at $^{31}$P frequency while having similar (i.e., 20% better) SNR near the array center. Individual elements of a double tuned phased array may be realized using either a single double tuned coil resonating at two frequencies or two separate coils located closely to each other.

The single double-tuned coil resonating at two frequencies is described in Schnall et al, *A new double-tuned probe for concurrent $^1$H and $^{31}$P NMR*, 65 J. Magn. Reson. 122-129(1985), which is incorporated by reference herein in its entirety. Two separate resonance surface coils resonating at two frequencies are described in Klomp et al, *Radiofrequency probe for 1H decoupled $^{31}$P MRS of the head and neck region*, 19 Magn. Reson. Imag. 755-759 (2001) and Dabirzadeh et al, *Trap design for insertable second-nuclei radiofrequency coils for magnetic resonance imaging and spectroscopy*, 35B(3) Conc. Magn. Reson. B: Magn. Reson. Eng. 121-132 (2009), which are incorporated by reference herein in their entirety.

In both cases, the inventors have discovered that there is a benefit if the decoupling device is also double tuned. The two current patterns of the Type I and Type II RID circuits of FIGS. 2 and 7 may be realized simultaneously using a double tuned (resonance frequencies–$f_1,f_2$) 2-mode detuning coil.

Figure 9:
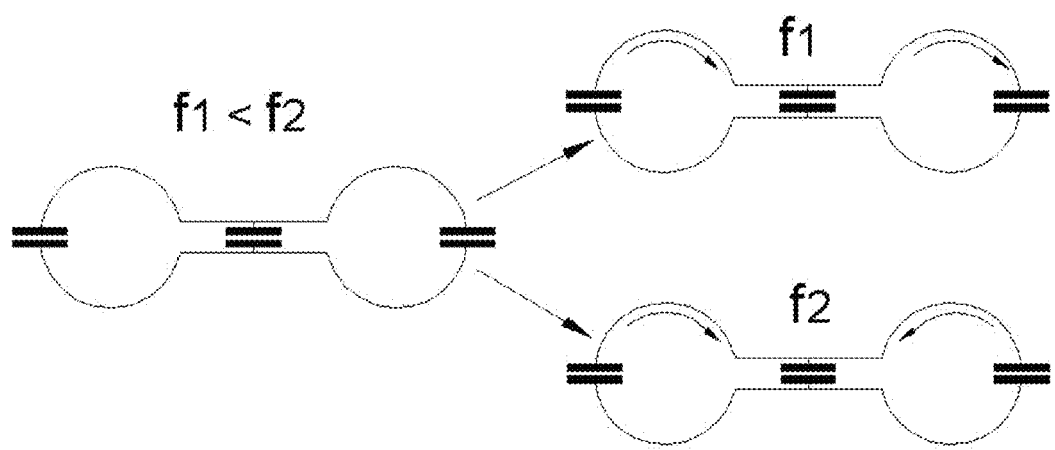
FIG. 9 illustrates a double-tuned resonant inductive decoupling circuit according to an embodiment.

FIG. 9 presents a low-pass embodiment of a double tuned detuning-coil according to an embodiment. The lower frequency Type II RID circuit (resonance frequency $f_1$) produces loop currents flowing in the same direction, and the higher frequency Type I RID circuit (resonance frequency $f_2$) generates currents in opposite directions.

Figure 10:
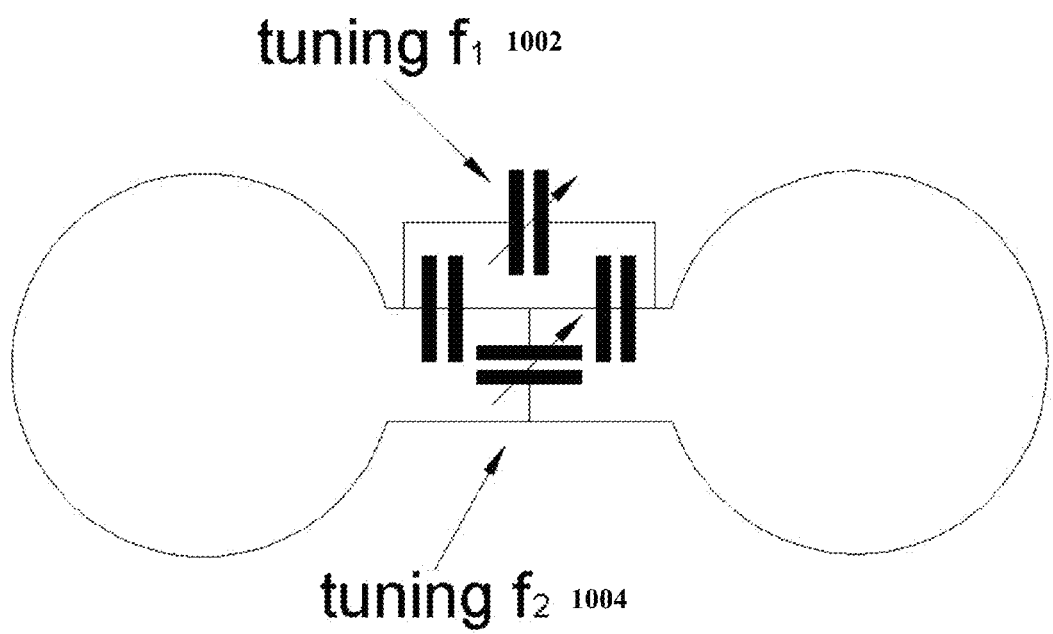
FIG. 10 is an electrical schematic of a double-tuned resonant decoupling circuit according to an embodiment.

The modes may be utilized to decouple a pair of double-tuned surface coils when each mode is independently tuned. The higher frequency mode with opposite currents in the loops may be used to decouple the array elements at $^1$H frequency under conditions $f_2<f_{1H}$, while the lower frequency mode may decouple the array elements at X-nuclei frequency under conditions of $f_1>f_x$, where $f_x$ and $f_{1H}$ are X-nuclei and $^1$H are Larmor resonance frequencies. FIG. 10 is an electrical schematic of a double-tuned decoupling circuit.

The variable capacitor 1002 for $f_1$-tuning affects both modes while the $f_2$ capacitor 1004 tunes only the higher frequency mode. By varying both of them iteratively, a pair of array elements may be detuned at both frequencies.

In an alternate embodiment, the high-pass double-tuned decoupling coil may be used to decouple double-tuned surface coils. Here, the Type I RID circuit mode (i.e. $f_1>f_2$) compensates for the lowest frequency and is used for decoupling at the X-frequency. Consequently, the Type II RID circuit mode is used for decoupling at the $^1$H frequency. A selection between the low and the high pass decoupling structures may be determined by the capabilities of the Type I RID circuit in compensating for the resistive component $R_{12}$ of mutual impedance $Z_{12}$.

Figure 11:
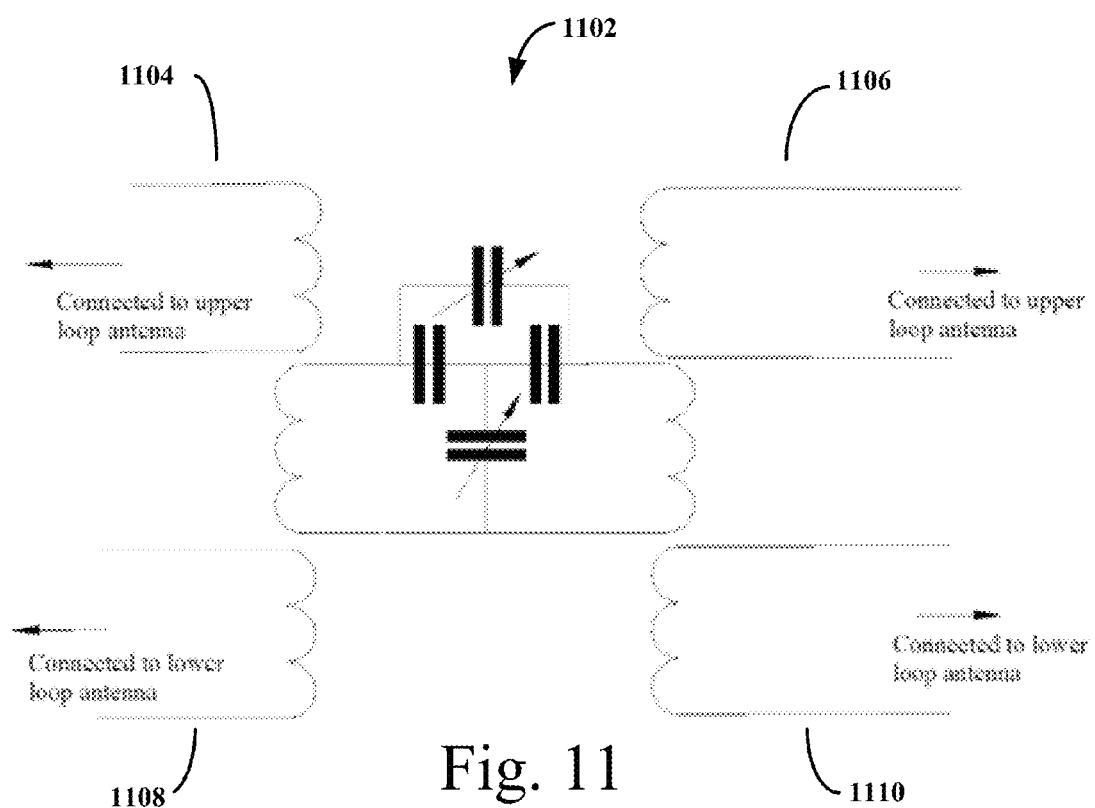
FIG. 11 is an electrical schematic of a double-tuned resonant decoupling circuit for a double tuned phased array.

FIG. 11 is an electrical schematic of a double-tuned decoupling circuit for a double tuned phased array 1102. The double-tuned phased array includes a first pair of array elements 1104, 1106 to operate a first frequency and a second pair of array elements 1108, 1110 located closely to the first pair to operate at a second frequency.

Decoupling Validation

To demonstrate the Type I and Type II RID circuit and verify the concepts, several 298-MHz ($^1$H frequency at 7T) two-array elements 104 were constructed with RID circuits 102 as well as with conventional non-resonant inductive decoupling circuits for comparison. These transceiver phased arrays were built using non-overlapped rectangular surface coils (i.e., array element) of the same size (7.5 cm×9 cm) with a 13 mm gap between adjacent (Δn=1) coils. Each surface coil was formed from copper tape (6.4 mm width)

with six capacitors (100C series, American Technical Ceramics, Huntington Station, N.Y.) uniformly distributed along the coil's length. All the coils were individually tuned and matched using variable capacitors (Voltronics, Denville, N.J.). The RID coils (4 mm ID) were built using 18-gauge copper magnet wire (diameter 1 mm) and positioned at ~10 mm distance from the surface coil plane to increase the separation from the sample.

Figure 12A:
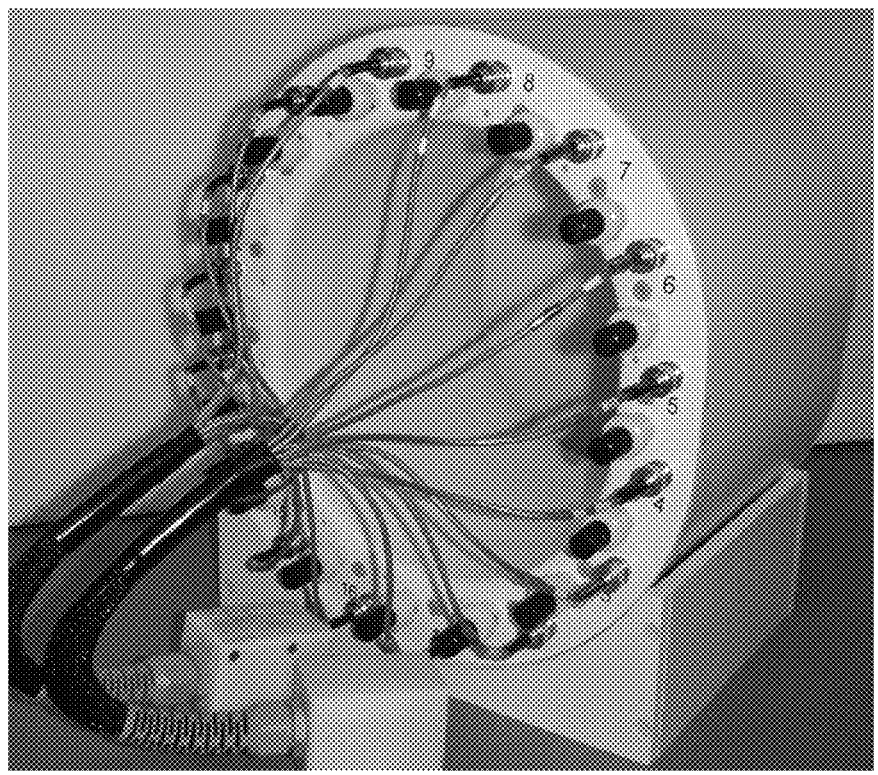
FIGS. 12A and 12B illustrate a 16-element single-row transceiver phased array adapted with resonant inductive decoupling circuits according to the illustrative embodiments.
Figure 12B:
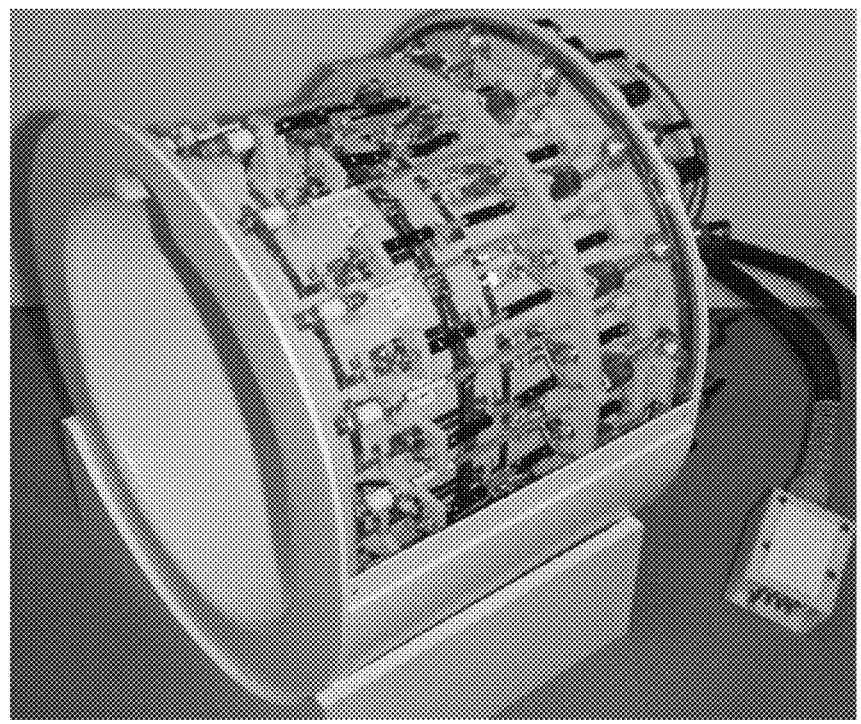

Additionally, a 16-element single-row (1×16) array consisting of smaller (5.6-width and 9 cm-length) overlapped rectangular array elements was constructed. FIGS. 12A and 12B illustrate the constructed 16-element single-row transceiver phased array. FIG. 12A shows the back side of the 1×16 phased array with the top cover removed. FIG. 12B shows the front side. The schematic of the transceiver phased array is provided in FIG. 3.

To ensure that the RF magnetic field produced by RID circuit is well localized and does not perturb the $B_1$ magnetic field of the array elements within the sample, a transmitted $B_1$ maps (phase and amplitude) is measured according to Pan et al, *Quantitative spectroscopic imaging of the human brain*, 40 MAGN. RESON. MED. 363-369 (1998), which is incorporated by reference herein in its entirety. The $B_1$ maps produced by array elements decoupled with the RID circuits were compared to the $B_1$ maps obtained by the array elements being decoupled with conventional non-resonant inductive decoupling. It is noted that the conventional non-resonant inductive decoupling is observed to not significantly perturb the RF field profile. The conventional non-resonant inductive decoupling was described in Avdievich et al, *Short Echo Spectroscopic Imaging of the Human Brain at 7T Using Transceiver Arrays*, 62 MAGN. RES MED. 17-25 (2009) and Avdievich, *Transceiver Phased Arrays for Human Brain Studies at 7T*, 41(2) APPL. MAGN. RESON. 483-506 (2011).

To mimic head loading conditions, two phantoms were constructed. Both phantoms are filled with NaCl and sucrose in water. The phantom has been described in Beck et al, *Tissue-equivalent phantoms for high frequencies*, 20B(1) CONC. MAGN. RESON. B: MAGN. RESON. ENG. 30-33 (2004), which is incorporated by reference herein in its entirety.

The percentages by weight were measured at 41.7%, 56.3% and 2.1% for water, sucrose and NaCl, respectively. The conductivity and the dielectric permittivity measured 0.57 S/m and 52 respectively, which approximates that reported for the human head at 300 MHz (1H resonance frequency at 7 T). The two-coil arrays were evaluated using a 2.0 L spherical phantom (16 cm dia.). The 1×16 array was evaluated using a cylindrical phantom with an elliptical cross-section (14 cm×17 cm). With the described solution this provides loading similar to that of an average sized human head. Coupling coefficients k and $k_0$ were estimated as previously described (27). Q-factors of RIDs were estimated from the frequency dependence of S12 and measured using a weakly coupled pair of pick up coils (28). Q-factors of the surface coils were evaluated using the frequency dependence of S11 (28). For the 1×16 array QU of individual surface coil elements measured 270. QL measured on an average size human head varied from ~70 ($Q_U/Q_L$=3.9) for the posterior coils (closest to the head) up to ~100 ($Q_U/Q_L$=2.7) for the anterior coils (furthest from the head).

All data were collected using a 7 Tesla Agilent Technology system. To test the coil performance, gradient echo images (256×256×13 slices) from an adult subject and a phantom were collected using ⅖ mm slice thickness/gap, 19.2 cm×19.2 cm field of view (FOV), TR=400 ms, nominal flip angle 15°. $B_1$ maps of the individual coils (single coil transmitting) or the combined array (all coils transmitting simultaneously) were collected using a rapid gradient echo dual angle method (25) with 64×64 resolution, TR=1 s, 5/5 mm slice thickness/gap centered on the matched gradient echo images. Human data was acquired under approval of local IRB.

Test Observations

Figure 15A:
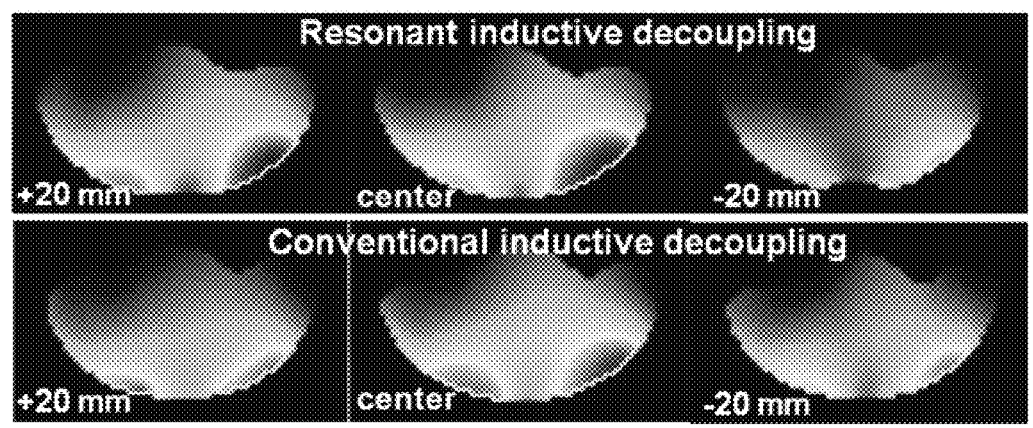
FIG. 15A shows the axial $B_1$ maps obtained using a $^1H$ 2-coil array with (i) a resonant inductive decoupling shown in FIG. 5A and (ii) a conventional inductive decoupling.

The geometry of the resonant decoupling circuit has been optimized to not disturb the profile of RF magnetic field $B_1$ produced by a pair of array elements 104. The RID circuits of FIGS. 5A, 5B and 5C were constructed. The Type I RID circuit was positioned, as shown in FIG. 5C, perpendicularly to the array element's plane to minimize distortion of the $B_1$ field. The assumption is that the distortion of the $B_1$ field produced by the decoupling coil is mostly happening along z-axis parallel to the surface coil plane and does not contribute to the MR signal. The inner diameter of the decoupling circuit of the RID circuit of FIG. 5A is measured at 22 mm, the $k_0$ is measured at ~0.06, and ξ is ~0.03. To produce similar $k_0$ value, the decoupling circuit of FIG. 5B is measured at 15×70 mm², and decoupling circuit of FIG. 5C is measured at 26×20 mm². From experimentation, the three decoupling circuits of FIG. 5A-5C were shown to disturb the $B_1$ magnetic field profile in the area located near the center between two surface coils and close to the surface coil's plane. As an example, FIG. 15A shows the axial $B_1$ maps obtained using $^1H$ (298 MHz) 2-coil arrays with the resonant inductive decoupling shown in FIG. 5A and the conventional inductive decoupling for three slices separated by 20 mm and located near the coil center.

Figure 13:
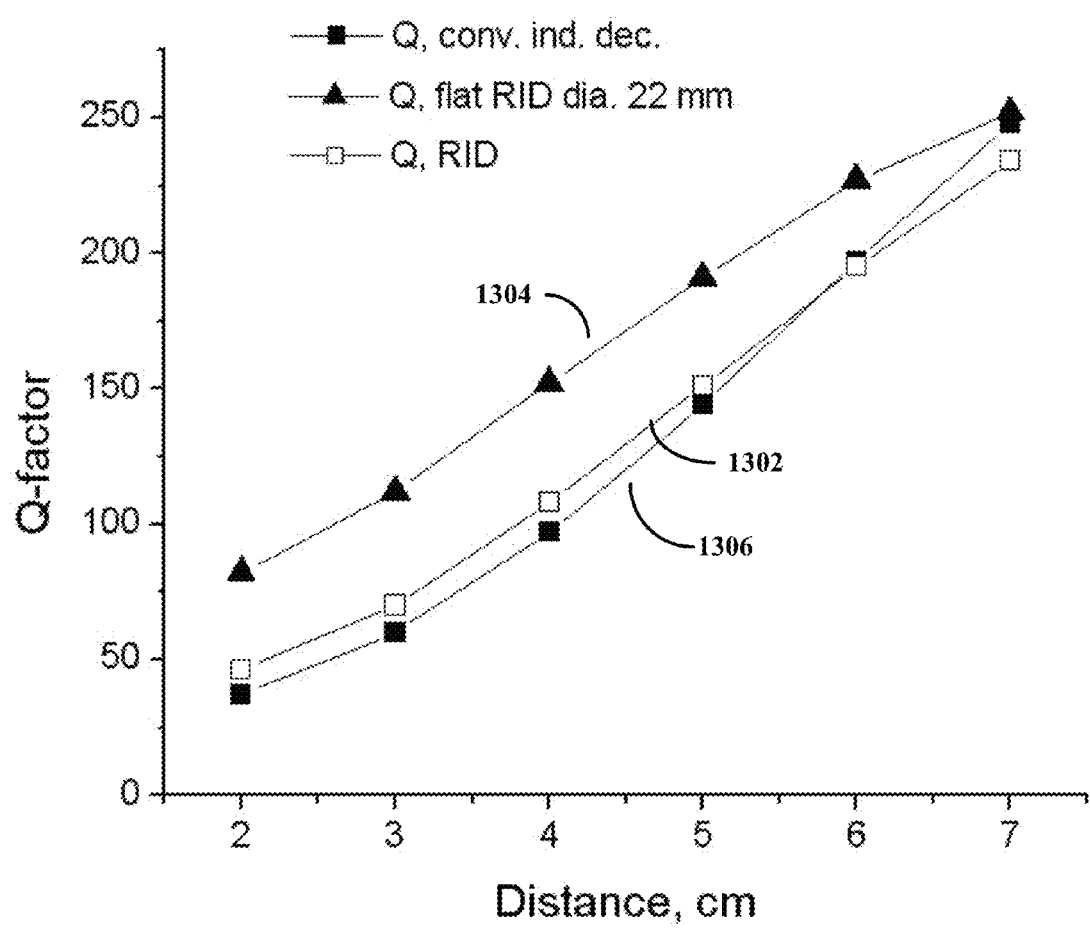
FIG. 13 is a plot illustrating the dependence of the loaded Q-factor $Q_L$ on the distance between a sample and the array elements.

It was also observed that the presence of the resonant decoupling circuit (FIGS. 5A-C) also strongly affected the surface coil loading. For example, loaded Q-factor QL increased from 30 to 53 for a two-coil array with the resonant decoupling shown in FIG. 5A loaded with the "braino" phantom. The increase is in comparison to an array with conventional inductive decoupling. FIG. 13 is a plot illustrating the dependence of the loaded Q-factor $Q_L$ on distance between the phantom and the surface coils. The figure was measured using the 2-coil array decoupled using (i) a non-resonant inductive decoupling circuit (measurement 1302), (ii) the optimized RID circuit 102 (measurement 1304), and (iii) the 16 mm "flat" RID circuit of FIG. 5A (measurement 1306).

It was also observed that simply decreasing the sizes of the decoupling coils did not minimize $B_1$ distortion. Decrease of the size of the decoupling coils leads to the decrease in $k_0$ and according to Equation 4 to decrease in ξ value. Even for smaller decoupling coils, distortions of the $B_1$ magnetic field as well as change in QL increased when the resonance frequency $\omega_0$ approached the $\omega_L$ value. To decrease the size of the decoupling coils without decreasing $k_0$ and ξ values, the geometry of the decoupling circuit is modified.

It was observed that the resonant inductive decoupling circuit 102 compensates for both components of the mutual impedance between the array elements 104 and does not disturb the $B_1$ magnetic field produced by the array elements 104. The resonant inductive decoupling circuit 102 had a smaller size inductor (loop ID=4 mm) and produced a substantially larger $k_0$ ($k_0$ measured being 0.14) and ξ values (value=0.13). Additionally, using the resonant inductive decoupling circuits 102, the $B_1$ maps (both amplitude and phase) obtained were observed to be practically identical to $B_1$ maps obtained using conventional inductive decoupling.

Figure 14:
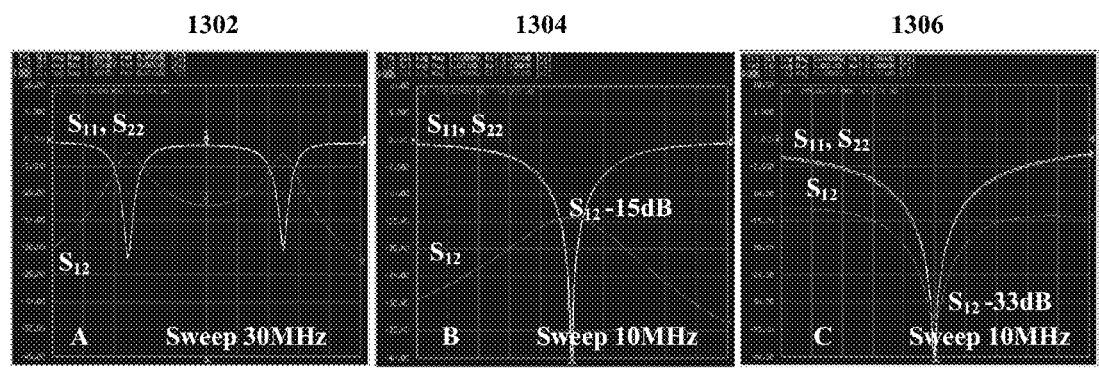
FIG. 14 shows results for a $^1H$ 2-coil array decoupled with different types of decoupling circuits.

Cancellation of the cross-talk between array elements 104 using the resonant inductive decoupling circuit 102 was also verified. FIG. 14 shows results obtained for $^1$H 2-coil array with the surface coils. Sub-plot A (1302) shows a measurement when the transceiver is unloaded and coupled. Subplot B (1304) shows a measurement when the transceiver phased array is loaded and decoupled using a common inductive decoupling method, which compensates merely for the reactive component. It was observed that when the array was loaded with a phantom located 4-5 cm away, the decoupling does not produce a result better than −15 dB. Subplot C (1306) shows a measurement when the transceiver phased array is loaded and decoupled using the resonant inductive decoupling coil 102. It is observed that under the same measurement condition, a decoupling better than −30 dB was obtained.

Figure 15B:
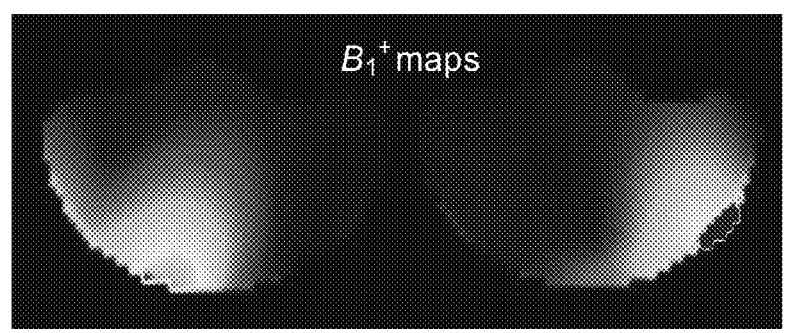
FIG. 15B shows the $B_1^+$ maps of individual array element decoupled with the resonant inductive decoupling circuit according to the illustrative embodiment.

FIG. 15B shows the $B_1^+$ maps of individual array element 104 decoupled with the resonant inductive decoupling circuit 102. As observed, the array elements 104 have excellent decoupling to adjacent array elements.

The resonant inductive decoupling circuit 102 was verified on an 8-coil (1×8) $^1$H transceiver phased array circumscribing the entire head. It is observed that the decoupling was better than −27 dB for all adjacent surface coils and better than −20 dB for all surface coils. The measurement was performed on average-sized human head. FIG. 16A shows an image of a human patient scanned with the transceiver phased array 100 decoupled with the resonant inductive decoupling circuit 102 according to the illustrative embodiments. FIG. 16B shows an axial $B_1^+$ map of the array elements 104 of the transceiver phased array 100 corresponding to the scanned image of FIG. 16A. As shown, the axial $B_1^+$ map demonstrates very good homogeneity.

For a double-tuned $^{31}$P/$^1$H 3-coil array, the double-tuned decoupling coil yielded decoupling better than −17 dB at $^{31}$P (120.7 MHz) and better than −22 dB at $^1$H (298 MHz) frequencies between all surface coils in the array. FIGS. 17A-C show axial $B_1^+$ maps of individual surface coils of the $^{31}$P/$^1$H array obtained at 298 MHz decoupled with the resonant inductive decoupling circuit according to the illustrative embodiment.

Figure 17D:
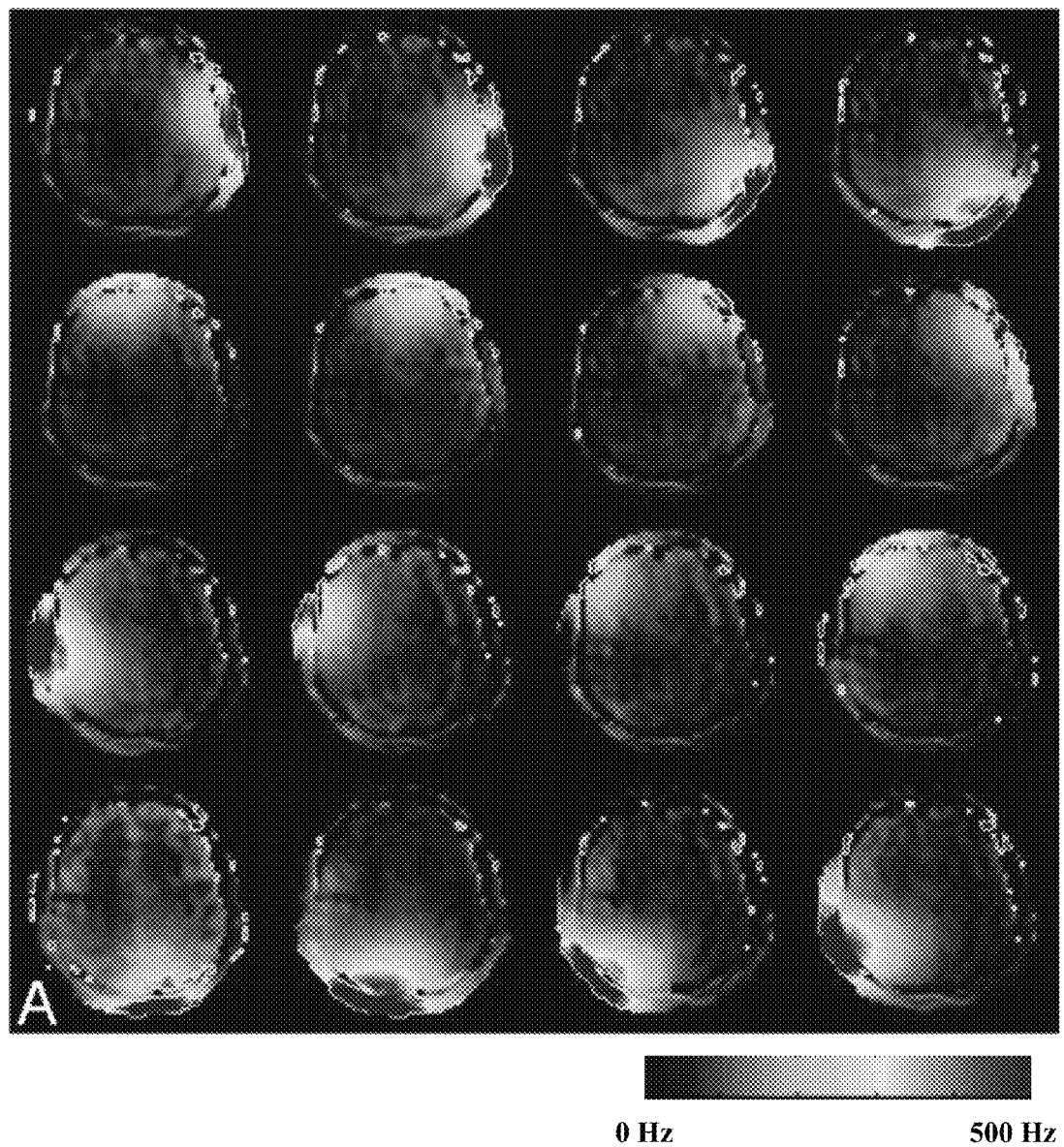
FIG. 17D shows axial $B_1^+$ maps for individual array elements of the transceiver phased array of FIGS. 12A and 12B configured with the resonant inductive decoupling circuit according to the illustrative embodiment.
Figures 17E, 17F:
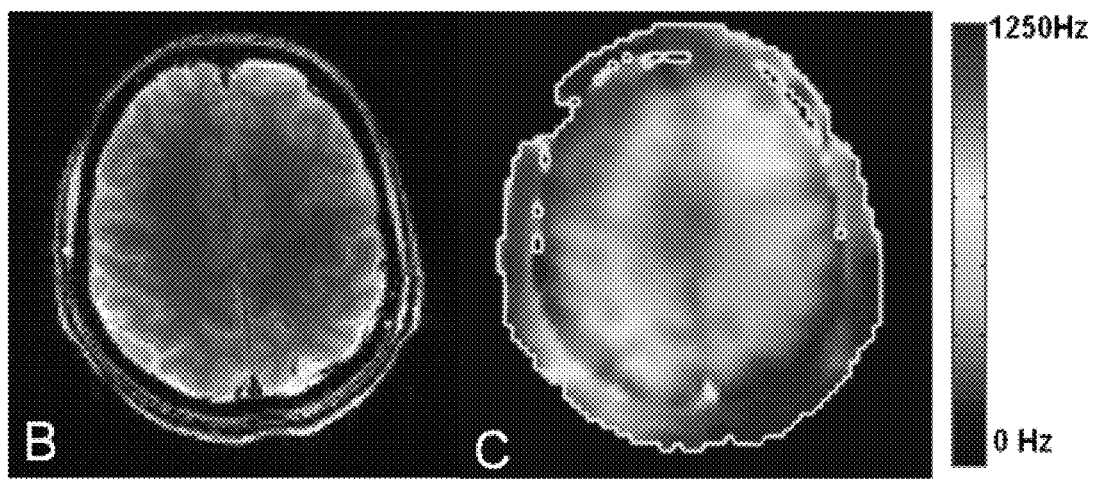
FIG. 17E shows an axial image of a human patient scanned using a 16-coil (1×16) overlapped array decoupled with resonant inductive decoupling circuits according to the illustrative embodiment.
FIG. 17F shows a $B_1^+$ map corresponding to the scanned image of FIG. 17E.

FIG. 17D shows axial $B_1^+$ maps for individual surface coil elements of the transceiver phased array of FIGS. 12A and 12B configured with the resonant inductive decoupling circuit according to the illustrative embodiment. The axial $B_1^+$ maps illustrate good decoupling between the individual array elements. FIGS. 17E and 17F show the axial image and corresponding $B_1^+$ map obtained using the 16-coil (1×16) overlapped array. Homogeneity was evaluated as the standard deviation of the $B_1^+$ over the entire slice and measured 9.2%.

While examples of resonant inductive decoupling have been described previously, such circuits compensate only for reactive component of coupling. Additionally, all these setups substantially perturb the sensitivity profile of the $B_1$ magnetic field due to large size of the decoupling elements and the close proximity between the resonant frequencies of the array elements and the resonant inductive decoupling circuit. Therefore the performance of such arrays is inferior to a transceiver phased array configured with resonant inductive decoupling circuits according to the illustrative embodiment.

Additionally, correcting this requires shifting the resonance frequency of the RID circuit significantly below that of the array element. This requires increasing the coupling coefficient $k_0$ while decreasing the physical size of the circuits. This condition cannot be fulfilled using conventional designs. See, for example, Aal-Braij et al, *A novel inter-resonant coil decoupling technique for parallel imaging*, 17 Proc. Intl. Soc. Mag. Reson. Med. 2974 (2009); Li et al, *ICE decoupling technique for RF coil array designs*, 38(7) Med. Phys. 4086-4093 (2011); and Soutome et al, *Vertical Loop Decoupling Method for Gapped Phased Array Coils*, 19 Proc. Intl. Soc. Mag. Reson. Med. 1859 (2011).

Also, despite evident benefits of super high fields (≥7T) for human imaging and spectroscopy, progress has been generally slowed down by hurdles associated with RF detector issues. High-field multi-element multi-row transceiver phased arrays, which may potentially provide an appropriate design for such probes, are generally still in the initial development stage mostly due to issues with decoupling of the individual antennas. For example, all previously described resonant decoupling circuits have not been able to (1) produce a very localized RF magnetic field that does not interfere with RF field of individual antennas so as not to spoil array transmission and reception properties, (2) cancel the mutual resistance, if present, and (3) be utilized for double-tuning to simplify the array design.

All the capacitive types of decoupling methods intrinsically require electrical connection and, therefore fail to cope with the challenge of array segmentation. Conventional inductive decoupling solves that issue of having no electrical connection but is difficult to control distantly especially for arrays with larger (>8) number of elements. The resonant inductive decoupling method according to the illustrative embodiment allows for (1) distant and easy adjustment, particularly as the number of decoupling elements for multiple-row arrays become very large and (2) absence of electrical connection to antennas to simplify array segmentation.

Common capacitive techniques have been demonstrated as a decoupling technique. See, for example, Adriany et al., *Transmit and receive transmission line arrays for 7 Tesla parallel imaging*, 53 Magn. Reson. Med. 434-445 (2005); Gilbert et al, *A Conformal Transceiver Array for 7 T Neuroimaging*, 67 Magn. Reson. Med. 1487-1496 (2012); Adriany et al, *A 32-channel lattice transmission line array for parallel transmit and receive MRI at 7 Tesla*, 63(6) Magn. Reson. Med. 1478-1485 (2010); and von Morze et al, *An eight-channel, nonoverlapping phased array coil with capacitive decoupling for parallel MRI at 3 T*, 31 Conc. Magn. Reson. B: Magn. Reson. Eng. 37-43 (2007).

It has also been shown that inductive decoupling methods may compensate merely for the mutual reactance. See, for example, Avdievich et al, *Short Echo Spectroscopic Imaging of the Human Brain at 7T Using Transceiver Arrays*, 62 Magn. Res. Med. 17-25 (2009); Avdievich, *Transceiver phased arrays for human brain studies at 7T*, 41(2) Appl. Magn. Reson. 483-506 (2011); Shajan et al, *A 16-Element dual-row transmit coil array for 3D RF shimming at 9.4 T*, Proceedings of the 20th Annual Meeting ISMRM, Melbourne, Australia, 308 (2012); and Roemer et al, *The NMR phased array*, 16 Magn. Reson. Med. 192-225 (1990). For example, for a pair of overlapped loaded surface coils the ratio of $R_{12}/R$, where R is the resistance of each surface coil, can measure from 0.2 to 0.4 (15,18). This corresponds to the residual coupling in the range of −14 to −8 dB. See Roemer et al, *The NMR phased array*, 16 Magn. Reson. Med. 192-225 (1990); and Wright, *Full-wave analysis of planar radiofrequency coils and coil arrays with assumed current distribution*, 15(1) Conc. Magn. Reson. B: Magn. Reson. Eng. 2-14 (2002).

By developing the decoupling method here, the limitation set forth above may be overcome and better decoupling obtained by compensating both reactive and resistive components of the $Z_{12}$.

The sequence of tuning a RID circuit may be as follows. A first pair of surface coils (coil #1 and #2) is provided on the cylindrical surface of a transceiver phased array. The RID circuit to couple to both of the array elements and is tuned to adjust the decoupling. An additional surface coil (coil #3) may be placed on the cylindrical surface of a transceiver phased array adjacent to the previously provided surface coil. If the coil #3 is in the same row of the array, then a RID circuit placed between coil #2 and coil #3 may be necessary. If coil #3 belongs to the different row, more of RID circuit may be necessary, including for example, diagonally adjacent array elements. Each RID circuits may be adjusted independently.

It should be appreciated by those skilled in the art that the various embodiments may be applicable to other resonant inductive decoupling circuits that meet the requirements described herein. For example, Thevinin and Norton equivalence of the various embodiments described in this application may be similarly decoupled.

It should be appreciated by those skilled in the art that the resonant inductive decoupling circuits described herein and method of usage thereof may be employed for surface coils as well as micro-strips.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method of operating a transceiver phased array in a magnetic resonance system to produce a dataset of a sample, the transceiver phase array including a plurality of array elements, the method comprising:
   providing a sample within the magnetic resonance system;
   energizing a pair of adjacent array elements of the transceiver phased array to cause transmission of a RF magnetic field by the pair of adjacent array elements and reception of a resonance signal by the pair of adjacent array elements from the sample, where the pair of adjacent array elements are used simultaneously for both transmission and reception and have cross-talk characterized as a mutual impedance therebetween comprising resistive and reactive components, the pair of adjacent array elements having a resonant inductive decoupling circuit that compensates for both the reactive and resistive components of the mutual impedance between the pair of adjacent array elements during transmission and reception; and
   producing the dataset based on the received resonance signal.

2. The method of claim 1, wherein the resonant inductive decoupling circuit is configured to inductively couple to the pair of array elements in a manner that the coupling does not distort the transmitted RF magnetic field of the array elements produced within the sample.

3. The method of claim 1, wherein the resonant inductive decoupling circuit comprises:
   a first small inductor connected in series with a first array element of the pair of adjacent array elements;
   a second small inductor connected in series with a second array element of the pair of adjacent array elements; and
   an electrically insulated resonant coil having a pair of windings including a first winding coupled with the first small inductor and a second winding coupled with the second small inductor.

4. The method of claim 1, wherein the resonant inductive decoupling circuit is configured such that flux generated by the pair of array elements produces two currents of opposing direction in the resonant inductive decoupling circuit, the two opposite currents provide conditions for compensating for both the reactive and resistive component of the mutual impedance between the pair of array elements.

5. The method of claim 3, wherein each of the two small inductors of the array elements and each of the pair of windings of the electrically insulated resonant coil is each formed having two turns to four turns.

6. The method of claim 1, wherein the resonant inductive decoupling circuit is configured to resonate at a resonant frequency $\omega_0$ sufficiently distant from a resonance frequency $\omega_L$ of the array elements to compensate for both the reactive and resistive components of the mutual impedance between the pair of array elements.

7. The method of claim 6, wherein the frequency shift, expressed as a difference between $\omega_0$ and $\omega_L$, is equal to $$\frac{k}{2\eta}\frac{Q}{Q_0}\omega_L,$$

where k is the coupling coefficient between array elements of the pair of array elements, $Q_0$ is a Q-factor of the resonant inductive decoupling circuit, Q is a Q-factor of the array elements, $\eta$ is a ratio between (i) a resistive component $R_{12}$ between the resonant inductive decoupling circuit and the array elements and (ii) a resistance value R of the array elements, and $\omega_L$ is the resonance frequency of the array elements.

8. The method of claim 6, wherein the resonant inductive decoupling circuit has a coupling coefficient $k_0$ with the array element sufficiently large to provide for a sufficiently large difference between the resonant frequency of the array element and the resonant frequency of the decoupling circuit (i.e. frequency shift) and has a size sufficiently small to not distort a RF magnetic field of the array elements produced within a sample.

9. The method of claim 8, wherein the sufficiently large coupling coefficient $k_0$ is equal to $$k\sqrt{\frac{Q_0}{\eta Q}},$$

where k is the coupling coefficient between array elements of the pair of array elements, $Q_o$ is a Q-factor of the resonant inductive decoupling circuit, Q is a Q-factor of the array element, and $\eta$ is a ratio between (i) a resistive component $R_{12}$ between the resonant inductive decoupling circuit and the array elements and (ii) a resistance value R of the array elements, and $\omega_L$ is the resonance frequency of the array elements.

10. A transceiver phased array for a magnetic-resonance system, the transceiver phased array comprising:

a plurality of array elements configured to interact with a sample, the plurality of array elements including a pair of adjacent array elements configured for simultaneous transmission and reception, the pair of adjacent array elements having cross-talk characterized as a mutual impedance therebetween comprising resistive and reactive components; and a resonant inductive decoupling circuit configured to inductively couple to the pair of adjacent array elements, the resonant inductive coupling circuit configured to compensate for both the reactive and resistive components of the mutual impedance between the adjacent pair of array elements during transmission and reception.

11. The transceiver phased array of claim 10, wherein the resonant inductive decoupling circuit is configured to inductively couple to the pair of array elements in a manner that the coupling does not distort an RF magnetic field within the sample produced by the pair of array elements.

12. The transceiver phased array of claim 10, wherein the resonant inductive decoupling circuit comprises:
a first small inductor connected in series with a first array element of the pair of adjacent array elements;
a second small inductor connected in series with a second array element of the pair of adjacent array elements; and
an electrically insulated resonant coil having a pair of windings including a first winding coupled with the first small inductor and a second winding coupled with the second small inductor.

13. The transceiver phased array of claim 12, wherein each of the two small inductors of the array elements and each of the pair of windings of the electrically insulated resonant coil is formed having two turns to four turns.

14. The method of claim 6, wherein the resonant inductive decoupling circuit includes a variable capacitor to tune the resonant inductive decoupling circuit to resonate at the resonant frequency $\omega_0$.

15. The transceiver phased array of claim 12, wherein each of the inductors of the pair of array elements is interleaved with the corresponding winding of the resonant inductive decoupling circuit.

16. The transceiver phased array of claim 10, wherein the resonant inductive decoupling circuit is configured such that flux generated by the pair of array elements produces two currents of opposing direction in the resonant inductive decoupling circuit, the two currents compensating for both the reactive and resistive component of the mutual impedance between the pair of array elements.

17. The transceiver phased array of claim 10, wherein the resonant inductive decoupling circuit is configured to resonate at a resonant frequency $\omega_0$ sufficiently distant from a resonance frequency $\omega_L$ of the array elements to compensate for both the reactive and resistive component of the mutual impedance between the pair of array elements and not distort the RF magnetic field of the array element produced within the sample.

18. The transceiver phased array of claim 17, wherein the frequency shift, expressed as a difference between $\omega_0$ and $\omega_L$, is equal to $$\frac{k}{2\eta}\frac{Q}{Q_0}\omega_L,$$

where k is the coupling coefficient between array elements of the pair of array elements, $Q_0$ is a Q-factor of the resonant inductive decoupling circuit, Q is a Q-factor of the array elements, $\eta$ is a ratio between (i) a resistive component $R_{12}$ between the resonant inductive decoupling circuit and the array elements and (ii) a resistance value R of the array elements, and $\omega_L$ is the resonance frequency of the array elements.

19. The transceiver phased array of claim 17, wherein the resonant inductive decoupling circuit has a coupling coefficient $k_0$ with the array element sufficiently large to provide for a sufficiently large frequency shift of the array element and has a size sufficiently small to not distort a RF magnetic field of the array elements produced within the sample.

20. The transceiver phased array of claim 19, wherein the sufficiently large coupling coefficient $k_0$ is equal to $$k\sqrt{\frac{Q_0}{\eta Q}},$$

where k is the coupling coefficient between array elements of the pair of array elements, $Q_o$ is a Q-factor of the resonant inductive decoupling circuit, Q is a Q-factor of the array element, and $\eta$ is a ratio between (i) a resistive component $R_{12}$ between the resonant inductive decoupling circuit and the array elements and (ii) a resistance value R of the array elements.

21. The transceiver phased array of claim 17, wherein the resonant inductive decoupling circuit includes a variable capacitor to tune the resonant inductive decoupling circuit to resonate at the resonant frequency $\omega_0$.

22. The transceiver phased array of claim 10, wherein the pair of adjacent array elements are overlapping.

23. A high-field multi-element multi-row magnetic-resonance transceiver-phased array comprising:
a plurality of array elements forming a first row of array elements and a second row of array elements, each array element having at least one adjacent array element having mutual impedance therebetween; and
a plurality of resonant inductive decoupling circuits inductively coupled between pairs of adjacent array elements, each resonant inductive decoupling circuit configured to inductively couple to the pair of adjacent array elements and compensate for both the reactive and resistive components of the mutual impedance between the adjacent pair of array elements during transmission and reception.

24. A double-tuned magnetic-resonance transceiver-phased array comprising:
a plurality of array elements including a pair of adjacent double-tuned array elements having mutual impedance therebetween, each of the double-tuned array elements configured to resonate at two resonant frequencies; and
a double-tuned resonant inductive decoupling circuit inductively coupled between the pair of adjacent double-tuned array elements, the double-tuned resonant inductive decoupling circuit comprising:
a first small inductor connected in series with a first double-tuned array element of the pair of adjacent double-tuned array elements;
a second small inductor connected in series with a second double-tuned array element of the pair of adjacent double-tuned array elements; and an electrically insulated resonant coil having a pair of windings including a first winding coupled with the first small inductor and a second winding coupled with the second small inductor.

25. The double-tuned magnetic-resonance transceiver-phased array of claim 24, wherein the mutual impedance includes both reactive and resistive components, and wherein the double-tuned resonant inductive decoupling circuit is configured to compensate for both the reactive and resistive components of the mutual impedance between the adjacent pair of double-tuned array elements during transmission and reception.

* * * * *